US011418109B2

(12) United States Patent
Healy et al.

(10) Patent No.: US 11,418,109 B2
(45) Date of Patent: Aug. 16, 2022

(54) MULTI-CHANNEL CINEMA AMPLIFIER WITH POWER-SHARING, MESSAGING AND MULTI-PHASE POWER SUPPLY

(71) Applicant: Dolby Laboratories Licensing Corporation, San Francisco, CA (US)

(72) Inventors: Andrew Healy, San Francisco, CA (US); Edward J. Neary, Pleasant Hill, CA (US); Erich H. Vogel, Oakland, CA (US); Andrew M. Poulain, San Jose, CA (US); Gregory J. Long, Inverness, CA (US); Joel A. Butler, Springfield, MO (US); Angela S. Williams, San Francisco, CA (US); Luca Revelli, Larkspur, CA (US); Dossym Nurmukhanov, Millbrae, CA (US); Tanner Cook, Alameda, CA (US); Marcelo Traverso M., San Jose, CA (US); Kenneth Schindler, Alameda, CA (US)

(73) Assignee: DOLBY LABORATORIES LICENSING CORPORATION, San Francisco, CA (US)

( * ) Notice: Subject to any disclaimer, the term of this patent is extended or adjusted under 35 U.S.C. 154(b) by 0 days.

(21) Appl. No.: 17/400,856

(22) Filed: Aug. 12, 2021

(65) Prior Publication Data
US 2021/0376711 A1    Dec. 2, 2021

Related U.S. Application Data

(63) Continuation of application No. 16/073,686, filed as application No. PCT/US2017/015459 on Jan. 27, 2017, now Pat. No. 11,121,620.
(Continued)

(30) Foreign Application Priority Data

Jan. 29, 2016 (EP) ..................... 16153471

(51) Int. Cl.
*H02M 1/32*    (2007.01)
*H03F 3/68*    (2006.01)
(Continued)

(52) U.S. Cl.
CPC ................. *H02M 1/32* (2013.01); *H03F 3/68* (2013.01); *H03G 3/007* (2013.01);
(Continued)

(58) Field of Classification Search
CPC ........ H02M 1/32; H02M 1/327; H02M 1/325; H03F 3/68; H03G 3/007; H03G 3/3005
(Continued)

(56) References Cited

U.S. PATENT DOCUMENTS 3,898,532 A    8/1975   Frank
5,200,708 A    4/1993   Morris, Jr.
(Continued)

FOREIGN PATENT DOCUMENTS

CN    1592089 A    3/2005
CN    101021451    8/2007
(Continued)

*Primary Examiner* — Tomi Skibinski

(57) ABSTRACT

An integrated cinema amplifier comprises a power supply stage that distributes power over a plurality of channels for rendering immersive audio content in a surround sound listening environment. The amplifier automatically detects maximum and net power availability and requirements based on audio content by decoding audio metadata and dynamically adjusts gains to each channel or sets of channels based on content and operational/environmental conditions. A power supply stage provides power to drive a plurality of channels corresponding to speaker feeds to a plurality of speakers. The amplifier has a front panel having an LED array with each LED associated with a respective channel or group of channels of the multi-channel amplifier, and a control unit configured to light the LEDs according to
(Continued)

display patterns based on operating status or error conditions of the amplifier.

20 Claims, 21 Drawing Sheets

Related U.S. Application Data

(60) Provisional application No. 62/450,543, filed on Jan. 25, 2017, provisional application No. 62/429,662, filed on Dec. 2, 2016, provisional application No. 62/429,682, filed on Dec. 2, 2016, provisional application No. 62/289,037, filed on Jan. 29, 2016.

(51) Int. Cl.
  *H03G 3/00* (2006.01)
  *H03G 3/30* (2006.01)

(52) U.S. Cl.
  CPC .......... *H03G 3/3005* (2013.01); *H02M 1/325* (2021.05); *H02M 1/327* (2021.05)

(58) Field of Classification Search
  USPC .......................................................... 381/107
  See application file for complete search history.

(56) References Cited

U.S. PATENT DOCUMENTS

| | | | |
|---|---|---|---|
| 5,940,518 A * | 8/1999 | Augustyn | H04R 29/003 |
| | | | 455/226.4 |
| 8,416,017 B2 | 4/2013 | Kohut | |
| 8,508,300 B2 | 8/2013 | Lee | |
| 8,559,655 B2 | 10/2013 | Mihelich | |
| 9,100,760 B2 | 8/2015 | Tackett | |
| 9,179,236 B2 | 11/2015 | Robinson | |
| 9,191,737 B2 | 11/2015 | Subat | |
| 2003/0138115 A1 * | 7/2003 | Krochmal | H04R 3/002 |
| | | | 700/71 |
| 2004/0176955 A1 * | 9/2004 | Farinelli, Jr. | H03G 3/301 |
| | | | 704/255 |
| 2004/0184619 A1 | 9/2004 | Inagaki | |
| 2004/0260416 A1 | 12/2004 | Kellom | |
| 2005/0017695 A1 | 1/2005 | Stanley | |
| 2005/0083114 A1 | 4/2005 | Risbo | |
| 2005/0162223 A1 | 7/2005 | Maejima | |
| 2006/0082414 A1 | 4/2006 | Xu | |
| 2006/0097784 A1 | 5/2006 | Lind | |
| 2006/0233055 A1 | 10/2006 | Hendrickson | |
| 2007/0069930 A1 | 3/2007 | Butler | |
| 2007/0247219 A1 | 10/2007 | Jesus Rodriguez | |
| 2008/0231463 A1 | 9/2008 | Feight | |
| 2009/0167228 A1 * | 7/2009 | Chung | H05K 7/20209 |
| | | | 318/473 |
| 2009/0220110 A1 | 9/2009 | Bazarjani | |
| 2009/0315623 A1 | 12/2009 | Dooper | |
| 2010/0123876 A1 | 5/2010 | Furihata | |
| 2010/0239102 A1 | 9/2010 | Miao | |
| 2011/0091052 A1 | 4/2011 | Wang | |
| 2012/0121105 A1 | 5/2012 | Holladay | |
| 2013/0329912 A1 | 12/2013 | Krishnaswamy | |
| 2014/0140540 A1 | 5/2014 | Staal | |
| 2014/0214431 A1 | 7/2014 | Vinton | |
| 2014/0247892 A1 | 9/2014 | Williams | |
| 2014/0265630 A1 | 9/2014 | Zhou | |
| 2015/0223002 A1 | 8/2015 | Mehta | |
| 2015/0271620 A1 | 9/2015 | Lando | |
| 2015/0327815 A1 | 11/2015 | Hwang | |
| 2015/0350804 A1 | 12/2015 | Crockett | |
| 2016/0192101 A1 | 6/2016 | Park | |
| 2018/0077491 A1 * | 3/2018 | Butler | G10L 19/008 |
| 2020/0395908 A1 * | 12/2020 | Schindler | H03F 3/3076 |

FOREIGN PATENT DOCUMENTS

| | | |
|---|---|---|
| CN | 101590863 | 12/2009 |
| CN | 101563841 B | 6/2012 |
| CN | 202565384 | 11/2012 |
| CN | 203603982 | 5/2014 |
| CN | 104348427 B | 2/2015 |
| CN | 104640053 A | 5/2015 |
| CN | 104977874 | 10/2015 |
| CN | 105164916 B | 4/2018 |
| EP | 0250488 | 1/1988 |
| EP | 2387149 | 11/2011 |
| EP | 2562931 | 2/2013 |
| EP | 2849341 | 3/2015 |
| JP | 59176913 | 10/1984 |
| KR | 20010095398 A | 11/2001 |
| KR | 20110077678 A | 7/2011 |
| WO | 2001026222 A1 | 4/2001 |
| WO | 2001071905 A2 | 9/2001 |
| WO | 2007087586 A2 | 8/2007 |
| WO | 2008037261 A1 | 4/2008 |
| WO | 2009010056 A1 | 1/2009 |
| WO | 2009070004 A1 | 6/2009 |
| WO | 2010075776 A1 | 7/2010 |
| WO | 2015105788 | 7/2015 |

* cited by examiner

1100

| CONDITION | PATTERN | EXAMPLE |
|---|---|---|
| Boot Up | Display Pattern 1 | LEDs Gradually Light and Change Color |
| Normal Operation | Display Pattern 2 | LEDs show signal strength |
| System Standby | No Display | LEDs Off, Power Light On |
| Channel Overload | Display Pattern 3 | Channel LED White |
| Channel Failure | Display Pattern 4 | LED Array Points to Bad Channel |
| System Failure | Display Pattern 5 | LED Array Flashes Red |
| Shutdown | Display Pattern 6 | LEDs Change Color and Gradually Dim |

*FIG. 11*

MULTI-CHANNEL CINEMA AMPLIFIER WITH POWER-SHARING, MESSAGING AND MULTI-PHASE POWER SUPPLY

CROSS-REFERENCE TO RELATED APPLICATIONS

This application is a continuation of U.S. patent application Ser. No. 16/073,686, which in term claims priority to European Patent Application No. 16153471.4 filed 29 Jan. 2016; U.S. Patent Application No. 62/289,037 filed 29 Jan. 2016; U.S. Patent Application No. 62/429,682 filed 2 Dec. 2016; U.S. Patent Application No. 62/429,662 filed 2 Dec. 2016 and U.S. Patent Application No. 62/450,543 filed Jan. 25, 2017 which are hereby incorporated by reference in their entirety.

FIELD OF THE INVENTION

One or more implementations relate generally to audio power amplifiers, and more specifically to a multi-channel power amplifier with power-sharing, fault monitoring, LED/GUI messaging, and multi-phase power supply stages.

BACKGROUND

Cinema sound has undergone significant changes with the advent of digital audio, digital cinema, and new immersive audio formats, such as Dolby Atmos®. Many channels of audio are now available for playback through extensive arrays of speaker in many large cinema environments. For large venues, the power requirements and the burdens placed on amplifier stages can be significant. FIG. 1 illustrates an example cinema environment having a surround sound speaker array powered by multiple power amplifiers as presently known. As shown in FIG. 1, a cinema or similar audio/visual (A/V) listening environment 110 has a screen 112 and a set or array of speakers 108 placed around the periphery of the listening environment 110 in any appropriate surround sound arrangement, such as 5.1, 7.1, 9.1 and so on. For the example of FIG. 1, speakers 114 may be Left (L), Center (C), Right (R) speakers along with a low frequency effects (LFE) speaker (not shown), and set or array of speakers 108 may be surround speakers in any appropriate configuration. For immersive audio playback, set or array of speakers 108 may also include overhead mounted height speakers (not shown). In a typical cinema or A/V application, the audio content is provided by projector 102 through a sound processor 104 and then to power amplifiers 106 to drive the speakers through individual speaker feeds.

The number of power amps needed to drive the speakers depends on the size of the venue and the size/type of speakers, as well as the audio content. In a modern cinema environment, a large number of power amps may be required. For example, a typical cinema installation with 200-300 seats and a screen size of 40' or greater may require on the order of 12 two-channel amplifiers in the amp array 106. Such an array of amplifiers requires substantial electrical circuitry and takes up a significant amount of space (e.g., two or more full height racks) and can also generate a lot of heat. This can be an issue in theatres that have small control booths with limited space and HVAC capabilities. Present cinema amplifier systems also do not dynamically accommodate changes in power requirements or environmental/operating conditions. One study of Atmos theatre content has shown that the combined power across all Atmos overhead speakers rarely gets above 300 W summed, although there are times when 300 W is needed per channel over a very limited time period. Present amplifier systems cannot share or steer power among the appropriate speakers in a manner that accommodates different per channel requirements. This issue is exacerbated with immersive audio content in which channel-based audio is augmented with a spatial presentation of sound which utilizes audio objects, which are audio signals with associated parametric descriptions of apparent position (e.g., 3D coordinates), apparent width, and other parameters. Such immersive audio content may be used for many multimedia applications, such as movies, video games, simulators, and can benefit from a flexible configuration and arrangement of speakers within the listening environment. A main advantage of immersive audio systems over traditional channel-based surround sound systems is the accurate representation of audio content around and above the listener as represented at least in part by height cues in the audio content. Optimal power sharing and steering of speaker feeds for arrays of speakers is particularly beneficial for this type of application, and is not met by present amplifier systems.

Present amplifier systems also do not accommodate changes in dynamic operating conditions or fault conditions. For example, as speakers fail or drop in performance, present systems do not detect such conditions or compensate for failed or compromised speakers or amp components. Furthermore, present amplifiers based on single power supply architectures are vulnerable to failures such as power supply failures in which the failure of a single supply may bring down the entire system.

Advanced cinema systems have required great increases in the capability and number of audio amplifiers used to power the loudspeakers. In modern digital cinemas, the "projectionist" has practically disappeared from the booth, as more automation occurs. Consequently, the staff operating the screens, sound, and projectors is less prepared when issues arise, and requires more readily understood cues for when issues need attention. Present cinema sound amplifiers, and other large-venue, multi-channel amplifiers do not provide adequate visual warnings. Typically, such amplifiers only feature an LED or light that indicates whether power is on. While some may provide additional LEDs that indicate signal strength, they do not feature extensive or informative fault condition alerts, or project this information far enough to be useful to anyone not standing directly in front of the unit. Another issue associated with modern digital cinema control booths is that there is a much higher ratio of machines to operators, and those operators are typically standing quite far away from the hardware. This means they are often surrounded by and confronted with meaningless blinking lights.

What is needed, therefore, is a cinema amplifier that features front panel light array that provides useful information indicating various fault conditions, and that projects this information to users that may be located some distance from the amplifier. What is further needed is a way of providing simple effective light-based messaging so that blinking light patterns can be readily understood to mean certain operating or failure conditions.

High channel count amplifiers may feature many channels that are powered by a single power supply. In the event of a power supply failure, all channels are lost. What is further needed, therefore, is an amplifier system that provides multiple redundancies so that failure of the power supply does not cause total failure of all channels of the amplifier.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF EMBODIMENTS

Embodiments are directed to an audio amplifier having a power supply stage coupled to a mains power supply and providing power to drive channels corresponding to speaker feeds to a plurality of speakers; a monitor component coupled to the power supply stage and monitoring environmental and operating characteristics of the amplifier; and a power controller coupled to the monitor component and adjusting per-channel gain values based on per-channel characteristics, power distribution characteristics, speaker health characteristics, and mains power supply characteristics.

The per-channel and power distribution characteristics may comprise the voltage of the mains power supply, a circuit breaker rating, a temperature of the power supply stage, and the load of the speaker feeds. The power supply stage provides maximum voltage and current on each channel of the speaker feeds under normal operating conditions and according to current and voltage availability of the mains power, and the controller reduces the gain to at least one of the channels in the event of a negative environmental or operating condition. The channels may be organized into a plurality of prioritized sets of channels, and the controller reduces the gain to a channel according to a priority of that channel relative to the other sets of channels. The amplifier further comprises an interface to a renderer that transmits digitized audio signals for transmission of the speaker feeds, and the controller can adjust the gain to the at least one of the channels based on the audio content from the renderer. The speakers may comprise a surround sound audio speaker array including height speakers for playback of object-based audio having height cues, and the audio signals may comprise immersive audio content.

Under some embodiments, the amplifier may further comprise a light control interface transmitting lighting control signals over speaker wires to a plurality of lights, and the amplifier power subsystem provides power to the plurality of lights. The light control interface receives metadata from the renderer that determines a color and intensity of each light of the plurality of lights. The power supply stage may comprise dual redundant power supplies or multi-phase power supplies that sum into a unified output, and the amplifier may be a Class-D amplifier.

Embodiments are further directed to an amplifier system comprising: a unitary chassis having a power supply powered by a single mains power outlet; a common power subsystem within the chassis and coupled to the power supply for driving a plurality of separate channels through corresponding speakers; a monitor circuit monitoring a total power level of the power subsystem and an individual power level of each separate channel; and an interface to a renderer having an immersive audio rendering component that applies defined channel gains in response to the monitored power levels. The monitor circuit further monitors each speaker to detect a failed or compromised speaker and adjusts the individual power level based on the presence of the failed or compromised speaker. The monitor circuit further monitors sound levels of a listening environment containing the speakers and adjusts the individual power level based on the sound levels. The amplifier system further comprises a power supply control unit regulating a power supply rail in response to the monitored power levels and audio output from the renderer.

Embodiments are yet further directed to a cinema audio playback system comprising: an amplifier having a power supply coupled to mains power and providing power to each speaker of a plurality of speakers over respective speaker wires through channel-based speaker feeds; a lighting control component providing power from the power supply to each light of a plurality of lights through the speaker wires; and an interface to a renderer generating immersive audio content comprising a digital bitstream having associated metadata for playback through the plurality of speakers, wherein the metadata includes lighting control signals dictating a color and intensity of the each light. The system further comprises a monitor component monitoring one or more operational conditions, and a controller adjusting a gain value on each channel of the channel-based speaker feeds based on the one or more operational conditions. The power supply provides maximum voltage and current on each channel under normal operating conditions and according to current and voltage availability of the mains power, and it reduces the gain to at least one of the channels in the event of a suboptimal operating condition in accordance a prioritization of a channel relative to other channels, or a defined shutdown or switchover procedure.

Embodiments are yet further directed to a multi-channel amplifier having a power supply stage providing power to drive a plurality of channels corresponding to speaker feeds to a plurality of speakers, a monitor component coupled to the power supply stage and monitoring environmental and operating characteristics of the amplifier, a front panel having an LED array comprising a plurality of LEDs with each LED associated with a respective channel or group of channels of the multi-channel amplifier, and a control unit coupled to the LED array and configured to light the LED array according to display patterns based on operating status or error conditions of the amplifier, and wherein at least one display pattern graphically shows the identity of a failed channel of the plurality of channels. The LED array may comprise a horizontal line of LEDs placed on the front panel, and each LED of the plurality of LEDs may be an RGB LED. The operating status and error conditions include system bootup, system shutdown, system standby normal operation of the plurality of channels, channel overload of at least one channel, channel failure of at least one channel, and system failure. A unique display pattern is generated for each of the plurality of states, and the display pattern is a function of an array sequence including an animation, where the animation comprises a set of LED transitions, and each transition comprises a lighting routine for a plurality of sequential LEDs. The display patterns comprise animations using different color, brightness, and blinking frequency characteristics of the LEDs, and transitions to and from successive displays of timed lightings of adjacent LEDs. The display pattern may comprise simulated motion by synchronized lighting of LEDs in the LED array created by successively turning contiguous LEDs on and off across the horizontal line of LEDs, and the display pattern identifies the failed channel by displaying two sweeping LED sequences that each start from one end of the horizontal line and end at a respective LED for the failed channel. The control unit may execute a timing routine for the display pattern that calculates a duration for each sweeping LED sequence and adjusts a timing of at least one sequence so that both sequences end at the respective LED at the same time. The LED control signals sent to the LED array may be simultaneously transmitted to a graphical user interface (GUI) of a computer wired or wirelessly coupled to the control unit, where the GUI includes a visual display area showing LED arrays corresponding to front panel LED arrays for each amplifier of a plurality of amplifiers monitored by the computer.

Embodiments are further directed to a method of graphically indicating operating status and fault conditions in a multi-channel amplifier by providing an array of LEDs in the front panel of the amplifier, assigning respective display patterns to the LEDs for each state of the amplifier, and lighting the LEDs based on a sensed operating status or fault condition, wherein at least one display pattern graphically shows the identity of a failed channel of the plurality of channels. The display patterns for normal operation comprise muted, steady state lighting effects using the LEDs and display patterns for fault conditions comprise bright, moving lighting effects using color, brightness, flashing periods, and timing intervals of sequences of LEDS to visually distinguish fault conditions from normal operation, and provide visual alerts to users that may be a distance from the amplifier.

Embodiments are further directed to a power supply for a multi-channel amplifier having a multi-phase power factor correction (PFC) circuit configured to boost input mains AC power to a PFC output voltage, wherein the PFC correction circuit comprises a first fault detection and protection array for each phase coupled to a respective boost stage, an interface to a system controller receiving fault information from the first fault detection and protection array for transmission to components that can effect failure compensation measures, and a first output combinatorial circuit summing an output voltage from each respective boost stage to produce a final PFC output voltage. The power supply may be a multi-phase resonant mode (LLC) power supply coupled to an output of the PFC circuit, where the LLC power supply has a second fault detection and protection array for each phase coupled to a respective converter stage, an interface to the system controller receiving fault information from the second fault detection and protection array for transmission to components that can effect failure compensation measures, and a second output combinatorial circuit summing an output voltage from each respective converter stage to produce a final LLC output voltage. In the power supply, a respective boost stage increases the input mains power by a defined power factor, and each respective converter stage divides the PFC output voltage into a number of phases corresponding to the number of converter stages. The system controller may initiate a compensation method in the event of a failure of one or more phases in the converter stages or the PFC boost stages, and wherein the compensation method comprises one of: limiting gain in one or more of the channels, or removing one or more channels from a total number of channels of the multi-channel amplifier. The PFC circuit may comprise a two-phase circuit and the LLC power supply comprises a three-phase circuit, and wherein the PFC output voltage is on the order of 390V. The power supply may have an interface to a user interface controller configured to display graphic messages to report any detected failure conditions according to pre-defined message formats through a front panel LED interface and/or and a computer graphical user interface.

Embodiments are yet further directed to methods of making and using or deploying the amplifier, speakers, and renderer components to provide control over the per-channel gains and lighting control in an immersive audio playback system.

INCORPORATION BY REFERENCE

Each publication, patent, and/or patent application mentioned in this specification is herein incorporated by reference in its entirety to the same extent as if each individual publication and/or patent application was specifically and individually indicated to be incorporated by reference.

BRIEF DESCRIPTION OF THE DRAWINGS

In the following drawings like reference numbers are used to refer to like elements. Although the following figures depict various examples, the one or more implementations are not limited to the examples depicted in the figures.

FIG. 11 is a table that illustrates various modes to be indicated through corresponding display patterns, under some embodiments.

DETAILED DESCRIPTION

Figure 1:
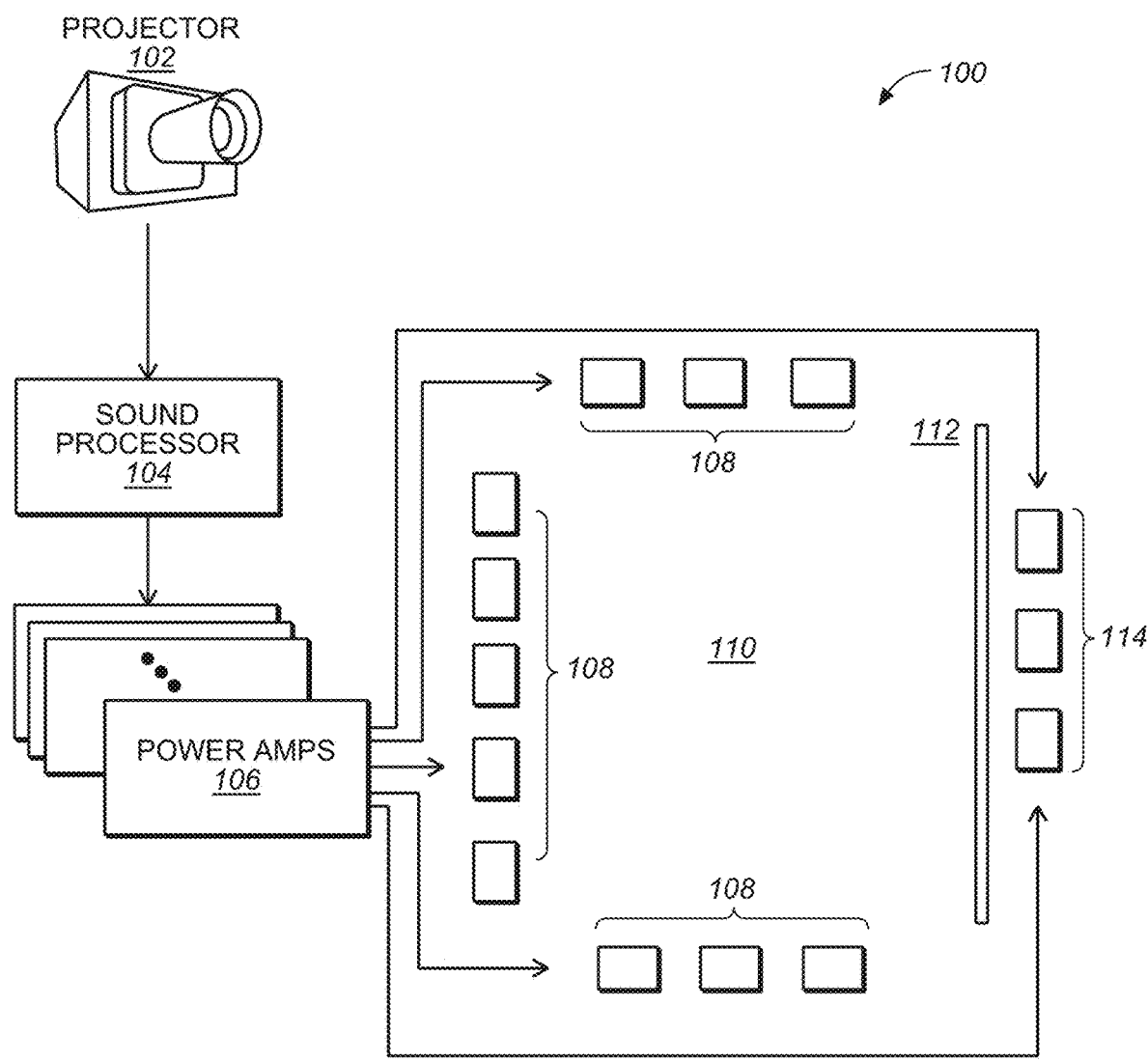
FIG. 1 illustrates an example cinema environment having a surround sound speaker array powered by multiple power amplifiers as presently known.

Systems and methods are described for an integrated cinema amplifier having a power supply stage that distributes power over a plurality of channels for rendering immersive audio content in a surround sound listening environment. The amplifier automatically detects maximum and net power availability and requirements based on audio content by decoding audio metadata and dynamically adjusts gains to each channel or sets of channels based on content and operational/environmental conditions. The amplifier monitors certain operational and environmental characteristics (e.g., temperature, voltage/current flow, load consumption, power supply condition, speaker health) and adjusts channel gains based on load and/or fault conditions. It also includes an interface to a renderer and can adjust channel gains based on audio content. It may also include a closed-loop synchronization circuit to ensure that channels are clocked and switched at the same time to mitigate noise, beats, and other distortion.

Systems and methods are also described for an audio amplifier having a multi-phase power supply for redundant provision of supply voltage, and a front panel LED messaging system and graphical user interface for reporting operational fault conditions. These components are intended for use in an integrated cinema amplifier having a power supply stage that distributes power over a plurality of channels for rendering immersive audio content in a surround sound listening environment. The amplifier automatically detects maximum and net power availability and requirements based on audio content by decoding audio metadata and dynamically adjusts gains to each channel or sets of channels based on content and operational/environmental conditions. The amplifier monitors certain operational and environmental characteristics (e.g., temperature, voltage/current flow, load consumption, power supply condition, speaker health) and adjusts channel gains based on load and/or fault conditions. It also includes an interface to a renderer and can adjust channel gains based on audio content.

The messaging system of the amplifier comprises a front panel LED user interface that shows different lighting patterns to indicate various different fault conditions, and that projects this information to users located some distance from the amplifier. This optimizes the amplifier operation in modern digital cinema control booths and installations where there is typically a high number of amplifiers and few operators who may be located some distance from the hardware. Unique LED array and programming sequences simplify and streamline visual communication of certain status and operating/fault conditions to the operators by providing "smart" light animations or sequences that quickly inform operators who may be located some distance away or briefly walking past the equipment In this manner, coded alerts can be easily seen at a distance to indicate specific failure conditions.

Aspects of the one or more embodiments described herein may be implemented in an audio or audio-visual (AV) system that processes source audio information in a mixing, rendering and playback system that includes one or more computers or processing devices executing software instructions. Any of the described embodiments may be used alone or together with one another in any combination. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

For purposes of the present description, the following terms have the associated meanings: the term "channel" means an audio signal plus metadata in which the position is coded as a channel identifier, e.g., left-front or right-top surround; "channel-based audio" is audio formatted for playback through a pre-defined set of speaker zones with associated nominal locations, for example, 5.1, 7.1, and so on (i.e., a collection of channels as just defined); the term "object" means one or more audio channels with a parametric source description, such as apparent source position (e.g., 3D coordinates), apparent source width, etc.; "object-based audio" means a collection of objects as just defined; and "immersive audio," (alternately "spatial audio" or "adaptive audio") means channel-based and object or object-based audio signals plus metadata that renders the audio signals based on the playback environment using an audio stream plus metadata in which the position is coded as a 3D position in space; and "listening environment" means any open, partially enclosed, or fully enclosed area, such as a room that can be used for playback of audio content alone or with video or other content, and can be embodied in a home, cinema, theater, auditorium, studio, game console, and the like.

Embodiments are directed to a sound processing and amplification system that is configured to work with a sound format and processing system that may be referred to as an immersive audio system that is based on an audio format and rendering technology to allow enhanced audience immersion, greater artistic control, and system flexibility and scalability. Such a system generally comprises an audio encoding, distribution, and decoding system configured to generate one or more bitstreams containing both conventional channel-based audio and object-based audio. An example of an adaptive audio system that may be used in conjunction with present embodiments is described in U.S. Provisional Patent Application 61/636,429, filed on Apr. 20, 2012 and entitled "System and Method for Adaptive Audio Signal Generation, Coding and Rendering."

An example immersive audio system and associated audio format is the Dolby Atmos platform. Such a system incorporates a height (up/down) dimension that may be implemented as a 9.1 surround system, or similar surround sound configuration (e.g., 11.1, 13.1, 19.4, etc.). A 9.1 surround system may comprise composed five speakers in the floor plane and four speakers in the height plane. In general, these speakers may be used to produce sound that is designed to emanate from any position more or less accurately within the listening environment. Though immersive audio (such as Atmos) may have been originally developed for movie programs played in cinema environments, it has been well adapted for home audio and smaller venue applications. Embodiments are generally described with reference to cinema or large theatre applications, but should be understood to apply equally well to home or smaller scale applications as well.

Figure 2A:
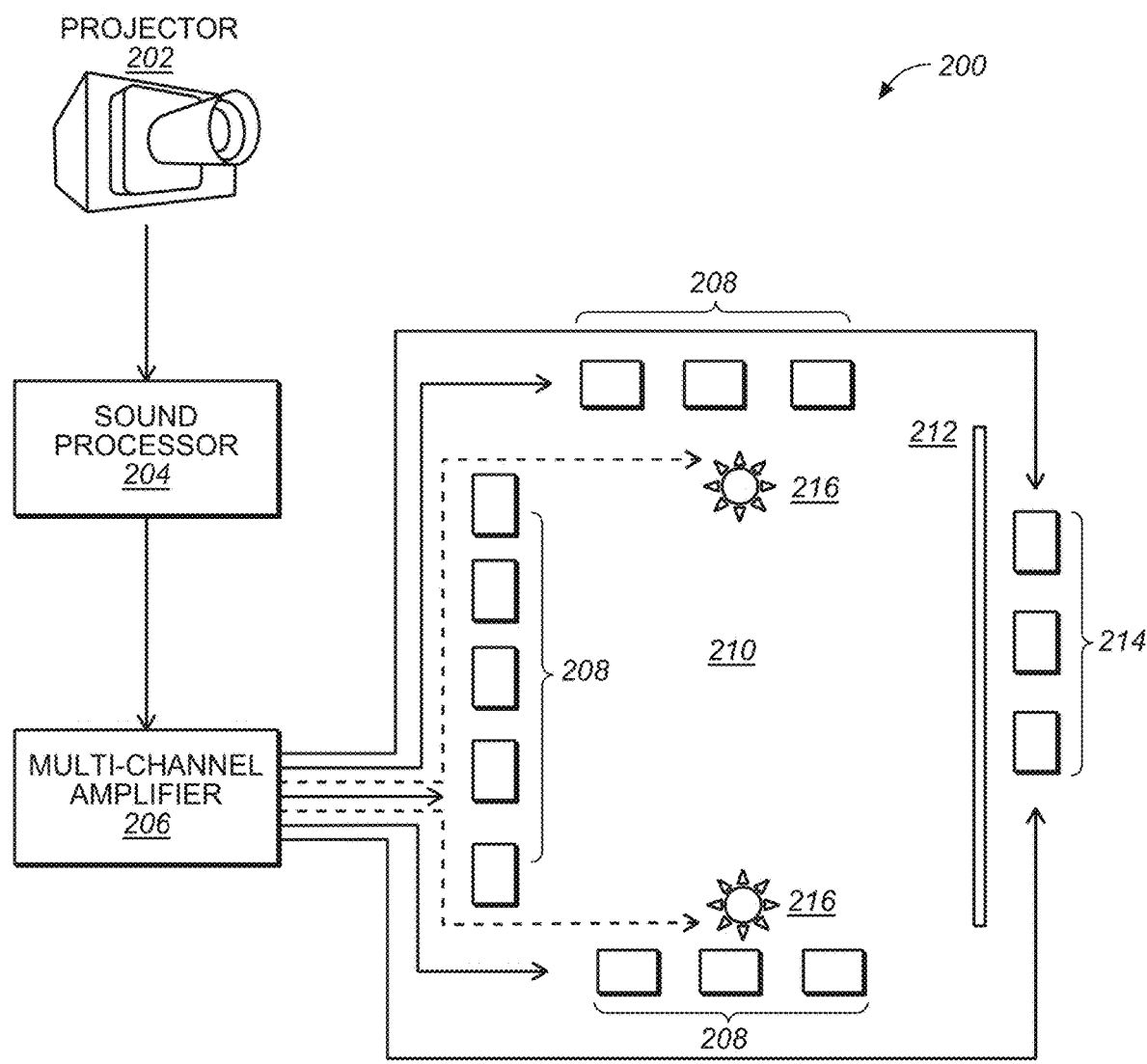
FIG. 2A illustrates a cinema environment having a surround sound speaker array powered by a multi-channel power amplifier under some embodiments.

FIG. 2A illustrates a cinema environment having a surround sound speaker array powered by a multi-channel power amplifier under some embodiments. As shown in FIG. 2A, a cinema or similar audio/visual (A/V) listening environment 210 has an array of speakers 208 and 214 placed around screen 212 and the listening environment in any appropriate surround sound arrangement (e.g., 5.1, 7.1, 9.1, etc.). The audio content is provided by projector 202 through a sound processor 204 and then to a multi-channel amplifier 206. Multi-channel amplifier 206 drives the speakers 208 and 214 through individual speaker feeds, and in contrast to the array of multiple individual amplifiers 106 shown in FIG. 1, it is a single unitary amplifier unit. In an embodiment, it is provided as a single component for rack mount installation when installed in an A/V booth of a cinema.

In an embodiment, amplifier 206 also includes circuitry (not shown) to power the main theatre lights 216 and optional mood or ambient lights (not shown) that may be placed throughout the theatre. This power can be transmitted over the speaker wires, and the lights may be standard theatre lighting or specially designed modules, such as multi-colored LED arrays (or similar energy efficient, electronically controlled, multi-colored lighting device) placed in appropriate locations of the listening area 210. In an alternative embodiment, the lights can be integrated in at least some of the speaker cabinets (not shown).

Figure 2B:
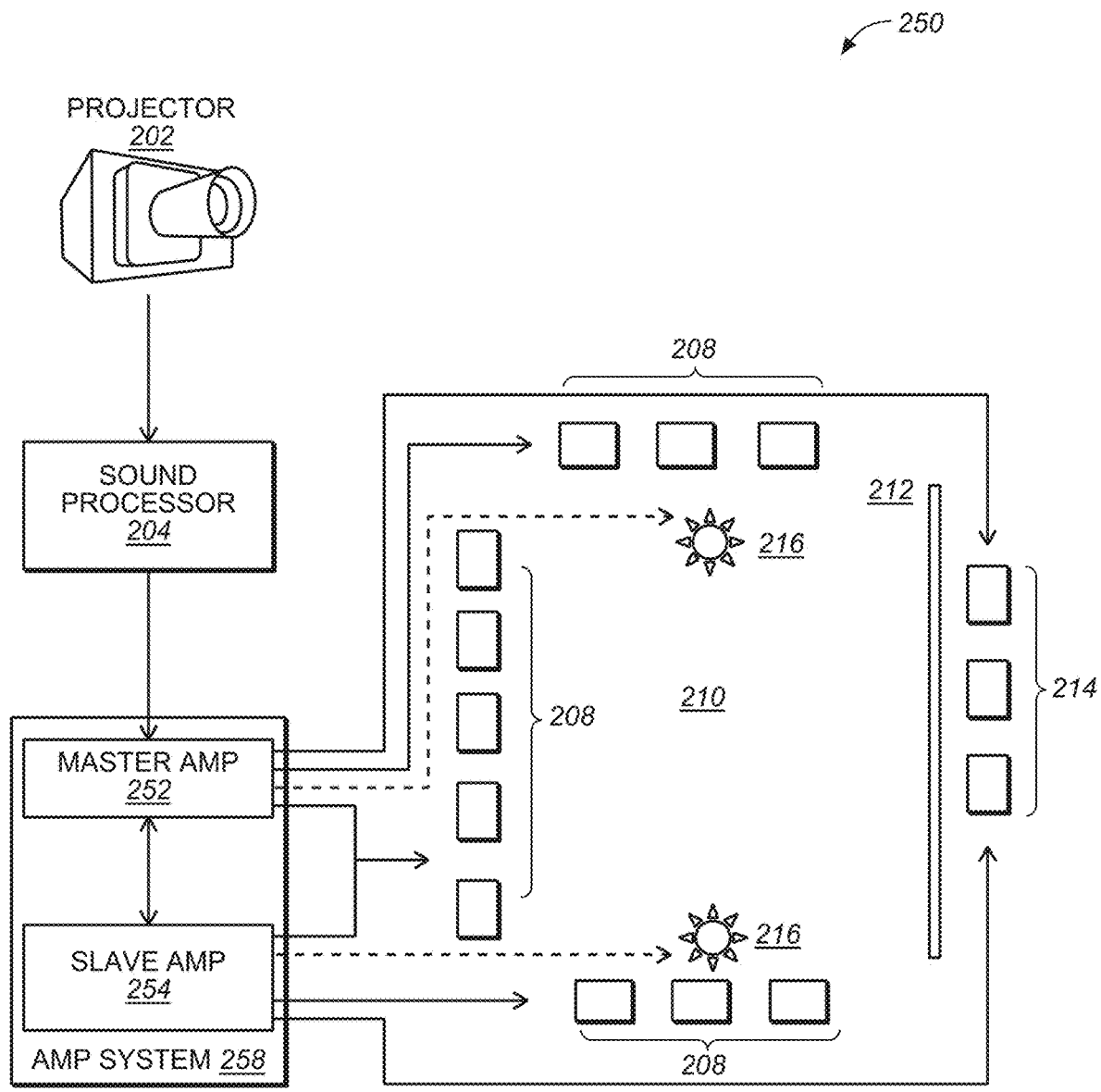
FIG. 2B shows two or more amplifiers connected together to form a master/slave configuration under an alternative embodiment.

For the embodiment of FIG. 2A, the amplifier 206 may be a single unitary amplifier. FIG. 2B shows an alternative embodiment in which two or more amplifiers may be connected together in a serial or daisy-chain fashion so that an amplifier system is formed having a master/slave configuration. FIG. 2B illustrates the system of FIG. 2A in which an amplifier system 258 comprises two amplifiers 252 and 254 coupled together serially to form a master/slave amp system in which the two amplifiers work together to power different speakers and/or lights of the listening environment 210, or in which they provide increased power capacity for the entire system (e.g., 600 w together instead of 300 w for a single amp), or redundancy functions in case of a failure or fault conditions. The amplifiers 252 and 254 may be connected over an AES67 interface or similar amplifier interface. For the embodiment of FIG. 2B, the master/slave amps are configured such that one amp 252 drives the lights and speakers on one side of the cinema 210, while the other amp 254 drives the lights and speakers on the other side of the cinema. Many other configurations are also possible such as having one amp drive only the lights or only the speakers, or having one amp drive the passive speakers (e.g., the surround speakers 208) and the other amp drive the powered speakers (e.g., the behind screen speakers 214), or having different amps drive different sets of interleaved speakers, etc. In an embodiment, the number of channels is increased by the each individual amplifier, such as 2×24 channels for a total of 48 channels for two amps in amp system 258. Alternatively, the master/slave amps may be configured such that number of channels remains the same, but the power overhead for each channel increases through the additional amplifier, or any other similar combination of channel and/or power overhead increase.

Although embodiments of FIG. 2B are shown with two amps 252 and 254, it should be noted that any practical number of amplifiers may be provided with a single master amp or amp array driving one or more slave amps.

For an embodiment in which an analog amplifier may be available to power the speakers, such as an older cinema installation, the amp system may be coupled to the analog amp through a digital-audio-converter (DAC) to convert the digital signals from the renderer or sound processor 204 into the requisite analog signals for the analog amp.

Figure 3:
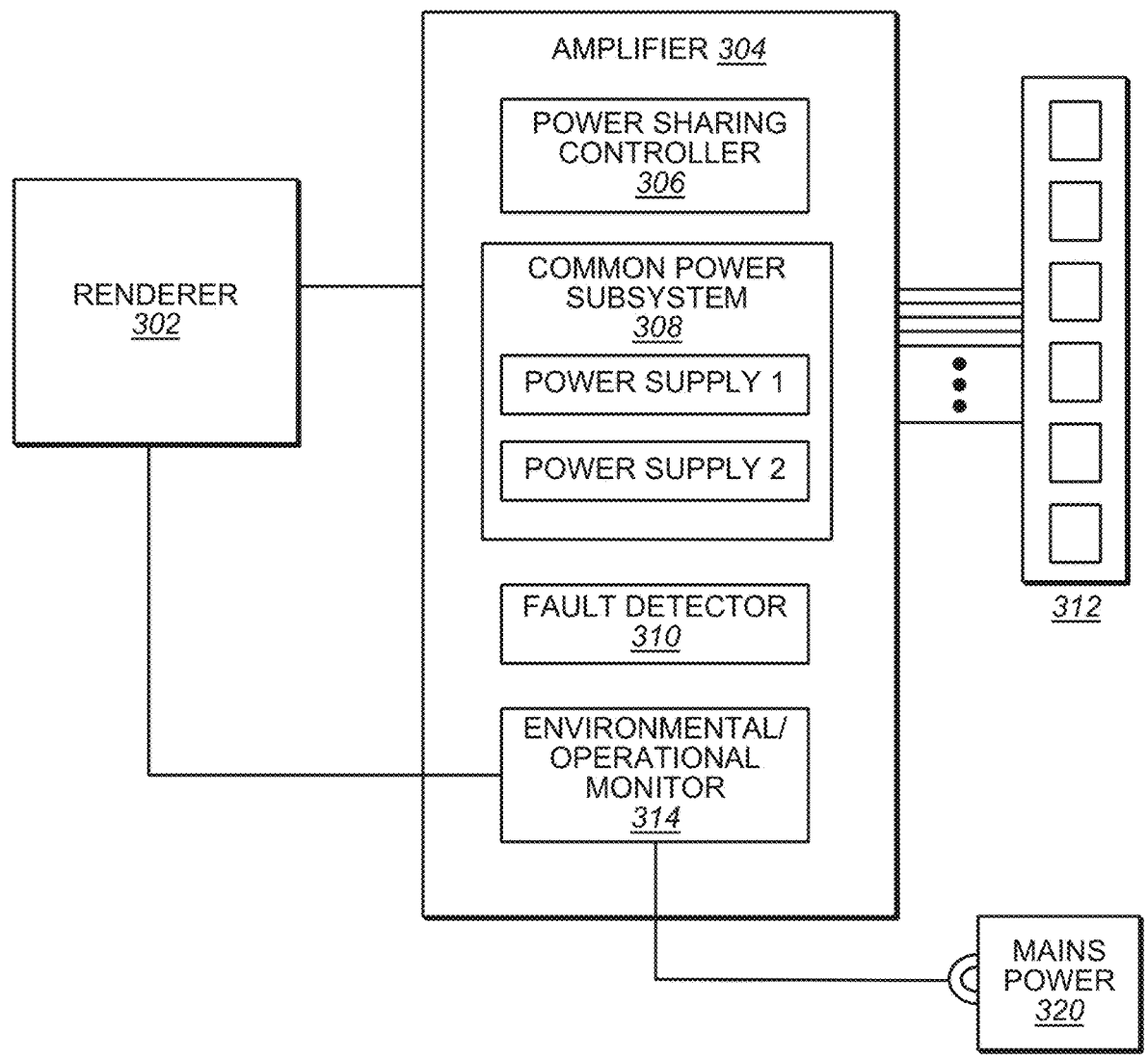
FIG. 3 is a block diagram illustrating main functional components of a multi-channel amplifier, under some embodiments.

FIG. 3 is a block diagram illustrating main functional components of a multi-channel amplifier, under some embodiments. For the system of FIG. 3, audio signals from renderer 302 are amplified in amplifier 304 and transmitted to speaker array 312.

In an embodiment, the speakers 312 of FIG. 3 are configured and placed to playback immersive audio content in which audio signals being presented to the listener originate from in front of and around the listening position in the horizontal plane (main speakers) and overhead plane (height speakers). A full loudspeaker system layout may consist of: front loudspeakers (e.g., Left, Center, Right, and optionally Left Center Right Center, Left Screen, Right Screen, Left Wide, and Right Wide), Surround loudspeakers (e.g.: Left Surround, Right Surround, and optionally Left Surround 1, Right Surround 1, Left Surround 2, Right Surround 2), surround back loudspeakers (e.g., Left Rear Surround, Right Rear Surround, Center Surround, and optionally Left Rear Surround 1, Right Rear Surround 1, Left Rear Surround 2, Right Rear Surround 2, Left Center Surround, Right Center Surround), height loudspeakers (e.g., Left Front Height, Right Front Height, Left Top Front, Right Top Front, Left Top Middle, Right Top Middle, Left Top Rear, Right Top Rear, Left Rear Height, Right Rear Height), and subwoofer speakers. This represents one example of a speaker configuration, and other configurations are also possible.

Component 302 generally represents an audio component that is generally referred to as a "renderer." Such a renderer may include or be coupled to a codec decoder that receives audio signals from a source, decodes the signals and transmits them to an output stage that generates speaker feeds to be transmitted to individual speakers in the room. In an immersive audio system, the channels are sent directly to their associated speakers or down-mixed to an existing speaker set, and audio objects are rendered by the decoder in a flexible manner. Thus, the rendering function may include aspects of audio decoding, and unless stated otherwise, the terms "renderer" and "decoder" may both be used to refer to an immersive audio renderer 302, such as shown in FIG. 3, and in general, the term "renderer" refers to a component that transmits speaker feeds to the speakers, which may or may not have been decoded upstream. In an embodiment, the AVR or renderer/decoder 305 of FIG. 3 comprises an audio/video receiver for use in home entertainment environments (home theater, home television, etc.). The AVR generally perform multiple functions. First, it provides a connection point for multiple source devices, and the AVR is responsible for switching among the inputs, and second, it performs audio decoding and processing (e.g., surround sound processing, Dolby Pro Logic™ processing, Dolby Digital™ processing, Dolby TrueHD™ processing, etc.). It may also provide amplification or pre-amplification for speakers. For the embodiment of FIG. 3, the amplification to drive the speakers 312 is provided by power amplifier 304.

In an embodiment, amplifier 302 is a multi-channel, Class-D amplifier that comprises main functional components of a power sharing controller 306, a power subsystem 308, and a fault detector 310. An environmental/operational monitor 314 may be provided as part of the amplifier or as a separate component that provides certain operating and environmental condition data to the amplifier. Amplifier 314 is preferably packaged in a single housing to provide a unitary component that works with a compatible renderer or sound process with respect to providing a number of separate channels (e.g., 24 channels) for playback of immersive audio content.

In an embodiment, the amplifier 304 provides power sharing or power steering of the common power sub-system 308 across all of the channels of a multi-channel speaker output stage. In an example configuration, up to 24 channels may be supported, but other possible embodiments are not so limited. The power subsystem (or "power supply stage") 308 may utilize two redundant power supplies (e.g., connected in series or parallel), though other single or multi-power supply configurations are also possible. The power supplies are redundant in that failure of one supply will cause the other supply to kick in and provide power to the amplifier. The fault detector 310 monitors the status of the power subsystem 308 and detects the health of the power supplies. It is configured to shut down a failing supply if an error is detected and utilize the remaining power supply to power the unit. In an embodiment, the power supplies may be configured to run in parallel so that either supply can provide full power, or they can be run in parallel with each supply providing half the power. In this case, failure of one supply may cause audio to play at half the available power (e.g., 41V instead of a full 82V), but this prevents the condition where no audio is available in the case of a power failure.

In an embodiment, the power supply stage may comprise a plurality of individual power supplies configured in a multiple phase architecture, where the different power supplies are designed to operate with different phase angles and sum into a unified output. This embodiment uses multiple power supplies at different phase angles that are then summed at the outputs to form a singular output. This technique improves power conversion efficiency, evenly distributes thermal dissipation, and allows redundancy within the power supply stage.

In an embodiment, the internal or external environmental/operational monitor 314 periodically samples the audio performance of the theatre or cinema 210 on a regular basis and detects and predicts speaker issues, such as a drop in performance, a blown speaker or one that has introduced rub/buzz. The amplifier is configured to shut that channel down and notify the renderer 302 to re-render the content, mapping out that faulty speaker and use the other speakers to compensate for the failed or missing speaker. It can also detect non-speaker performance issues, such as rub and buzz, in a fixture or tile in the theatre. This information may be accommodated through re-rendering, or it can be reported to system administrators or personnel.

In an embodiment, the power supply is designed to allow the system to operate from a normal 120 VAC 20 Amp service without blowing the AC mains circuit breaker. To this end, feedback from the power supply shall be available from the power supply to signal the system that the maximum output is being reached so as not to allow the amplifier to scale-back processing to eliminate an over current condition on the mains supply. The amplifier is also configured to operate a wide range of possible supply voltages based on country of use or local power supply variations. For example, mains power can vary from a low of 100V in Japan to a high of 240V in Australia. The setting of 240V at 20 amps thus represents the maximum power that the amp can deliver without tripping any circuit breakers in an installation, and this maximum power output is tailored for each different installation. The monitor 314 and controller 306 components provide the maximum power delivered based on the input power available.

As shown in FIG. 3, the monitor component 314 is coupled to the mains power 320, which represents a circuit breaker and power junction to the cinema or building power supply. Through this component, the amplifier is configured to detect the power supply levels provided by the mains power and to adjust the power delivered to the speakers 312 accordingly. The range of mains power can vary depending on country, or facility configuration (such as in buildings with selectable voltages), and the amplifier can be configured to accommodate a wide range of AC voltages, such as between 85-265 VAC at any appropriate phase and current. Maximum power levels can be programmed into the amplifier through user input using known supply ratings and circuit breaker ratings, such as may be provided during a configuration or installation operation. Alternatively, these values can be determined dynamically by the use of test signals and test voltages such as to deliberately reset/set the breaker to determine maximum voltage levels, or by reading relevant parameters from enabled intelligent power supply devices.

The power supply is designed to allow the system to operate from a normal (e.g., 120 VAC 20 Amp) service without blowing the AC mains circuit breaker. Feedback from the power supply is made available from the power supply to signal the system that the maximum output is being reached so as not to allow the amplifier to scale back processing to eliminate an over-current condition on the mains supply. Certain control signals are made available to the system controller 306 for this purpose, such as 95% power level reached, power fail indication, and power good.

Figure 4A:
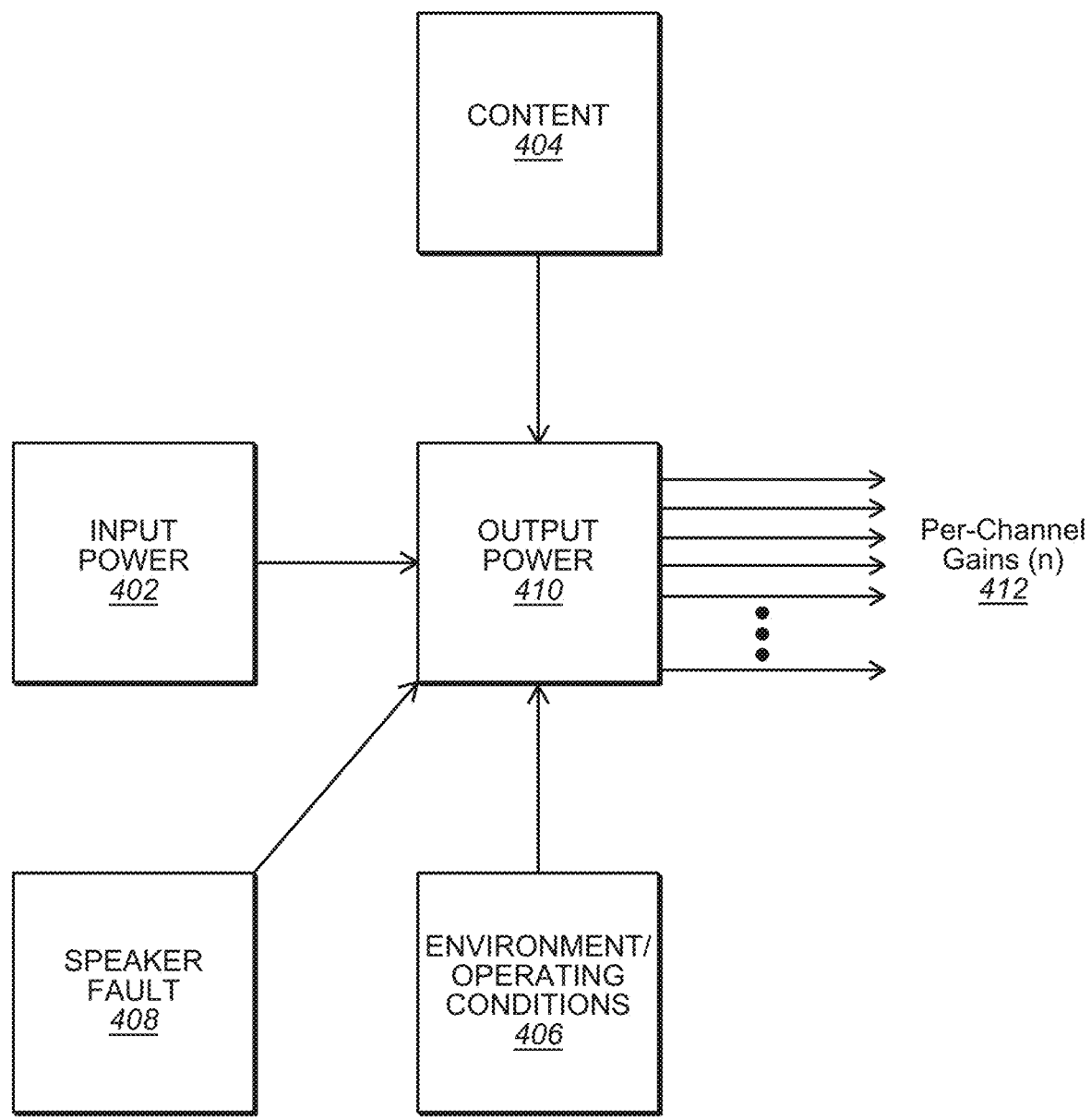
FIG. 4A illustrates the generation of per-channel gain levels based on certain amplifier operating characteristics, under some embodiments.

In an embodiment, amplifier 304 manages the gain of each individual channel based on certain environmental and operating conditions, as monitored by the fault detector 310 and environmental/operational monitor 314. FIG. 4A illustrates the generation of per-channel gain levels based on certain amplifier operating characteristics, under some embodiments. As shown in FIG. 4A, the per-channel gains 412 are derived from the output power 410 provided by the amp on each of the channels 1-n, where n is any appropriate number of channels, such as provided by the renderer 302. In an example embodiment in which the renderer corresponds to a Dolby Atmos Cinema Processor (CP850) or similar renderer, 24 audio channels are output from the renderer and amplified individually by amplifier 304. The output power 402 is a function of several inputs including the input power 402, the audio content 404 and the environmental/operational conditions 406. As described above, the input power 402 comprises the AC mains power voltage 320 and the current delivery and circuit breaker threshold. These values can be sensed by the amplifier and/or input into the amp by technician as part of amplifier installation and setup process. The input power 402 dictates the maximum amount of output power 410 that can be provided, and hence the maximum per-channel gain values 412 that are available to each of the channels individually and collectively. As also described above, the per-channel gains can also be set or modified depending on any speaker fault conditions detected by the fault detector 310. In the case of any failing or failed speakers, speaker cables, output stage, or any other specific channel component, power to that channel may be attenuated or cut and other channels boosted accordingly to compensate.

For the embodiment of FIG. 4A, the audio content 404 can also be used to determine the output power 410 for each channel. In this embodiment, the renderer provides appropriate data to the amp, such as through immersive audio metadata that is used by the amplifier to adjust the per-channel gains 412 accordingly. For example, certain center or front channels may be amplified greater than surround channels if the audio is primarily dialog rather than music. Such content-dependent gain control can be useful in certain suboptimal conditions, such as when the input power 402 is low so that instead of playing dialog at the same level as music or background audio at equally low levels, the dialog can be enhanced at the expense of the music to make it relatively more intelligible. The amplifier and renderer may be configured to communicate and generate speaker feeds according to a defined time-shift so that the amplifier can adequately process the audio content data and set the gain levels accordingly. For example, the renderer can send content data to the amplifier milliseconds ahead of the actual playback of the signals so that the amplifier has time to set the gain levels prior to sending the speaker feeds to the speakers.

In an embodiment, the monitor component 314 (of FIG. 3) monitors the mains power to provide an indication of any change of input power 402 to the amplifier. Any significant change may necessitate a change in the per-channel gains, such as a decrease in power requiring attenuation of certain channels, and an increase in power allowing for increasing the gain across all channels. The monitor 314 can also monitor other external conditions, such as ambient temperature in the control room or amplifier enclosure so that in a potential overheating situation or dangerous environmental condition, the output power 410 can be reduced or cut to prevent system failure. The operating conditions 406 represent certain internal amplifier conditions, such as current flow to the speakers, temperature on a per-channel basis, power supply health, temperature (thermals or thermal conditions) for the power supplies, load consumption on the speaker feeds, and certain Class-D control loop (modulation monitor) conditions. The amplifier is generally configured to provide full voltage and current on every channel depending on the input power 402 and other optional characteristics such as the content 404 and speaker health 408. In the event of any abnormal internal operating conditions, the output power can be adjusted to compensate for any problems or potential faults. For example, if the power supply thermal temperature is too high or if the speaker loads are too high, power can be cut.

In an embodiment, the power sharing controller 304 of FIG. 3 can be configured or programmed to reduce the gain values by certain defined amounts depending on the compromised or negative condition detected by either fault detector 310, monitor 314, or on the basis of changed audio content from the renderer 302. For example, the per-channel gain for any particular channel or channels can be successively cut by −3 dB until the fault or problem condition is alleviated. Internal feedback loops within the amplifier update the controller with respect to changed operating conditions in response to the changed per-channel gains. For example, in a power supply overheating situation, the controller may cut the gains across all channels until the monitor 314 detects stabilization in the thermal condition. Likewise, if a brown-out condition is detected in which mains power is significantly decreased, the gains may be cut until full power is restored, at which time, the controller may re-elevate the gains to their original levels.

The amplifier may also be programmed to implement specific channel shutdown or switchover procedures in the event of serious problems, such as failure of speakers or input power degradation (e.g., a brown-out or black-out condition). In such a case, for example, heavily loaded channels may be shut down and all available sound sent to one or a few low power speakers.

The output gains 412 can be set equally for all channels, or individually so that each channel or certain sets of channels have different gain values. In this manner, the per-channel gains can be adjusted to form a hierarchy or prioritized sets of gains. This allows the gains to be increased or decreased based on relevant characteristics such as content in relation to input power, potential failure conditions of speakers or power supply components, speaker loads, current draw, and so on. The order of priority dictates the relative amount of gain assigned on a per-channel basis for each level of priority. For example, with reference to FIG. 2A or 2B, speakers 214 may be assigned priority 1, the rear bank of surround speakers 208 may be assigned priority 2, the UR banks of surround speakers 208 may be assigned priority 3, and the LFE may be assigned priority 4. In this case, the priority 1 speakers may be the last speakers to be attenuated in case of adverse environmental or operating conditions, while the LFE and side surround speakers would be the first channels to be attenuated or cut. As should be noted, any grouping of channels and desired priority levels may be assigned depending on the capabilities and constraints of the playback system.

Figure 4B:
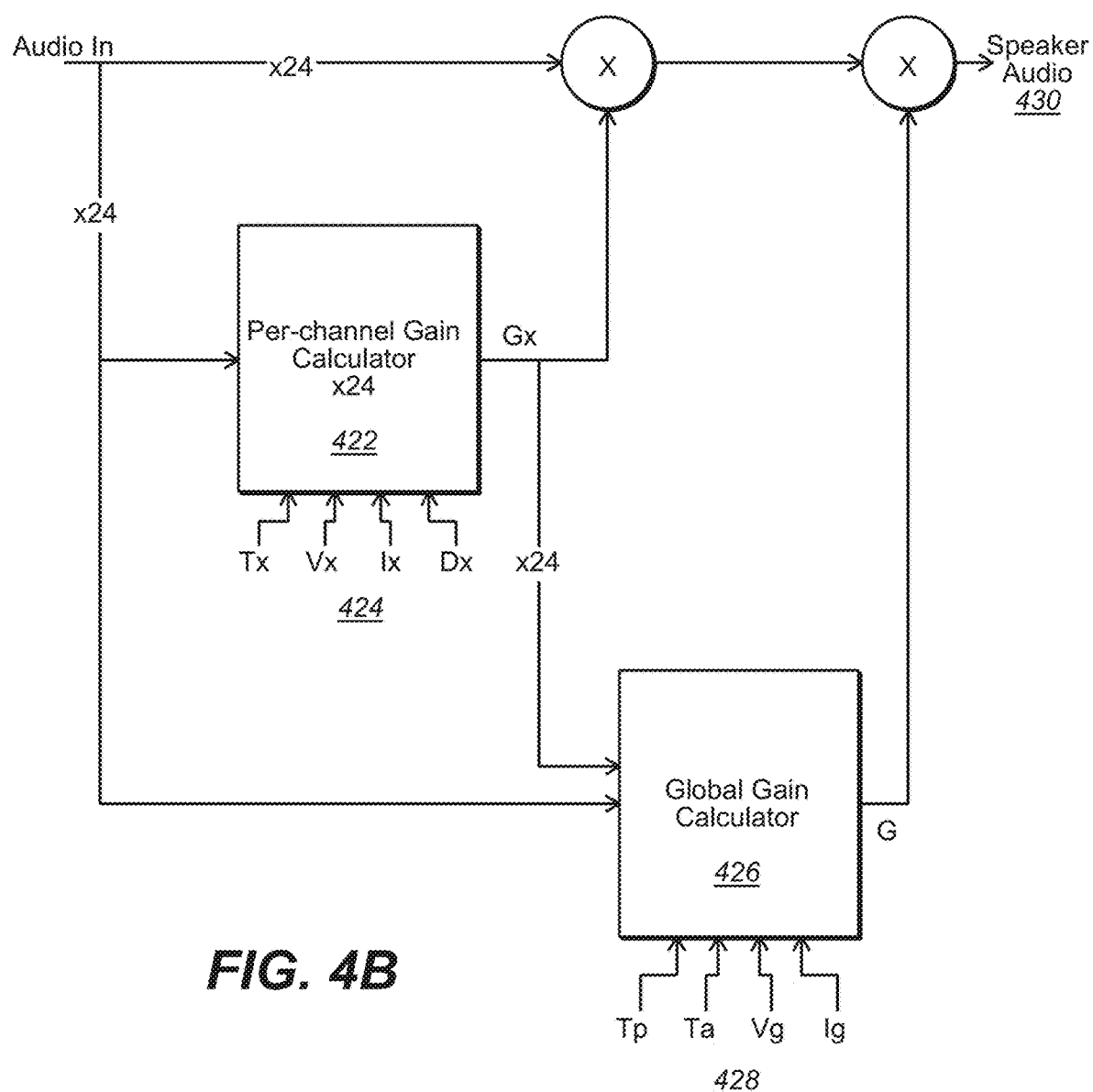
FIG. 4B illustrates calculation of per-channel and global gain values to determine audio output levels for the speaker feeds, under some embodiments.

In an embodiment, the per-channel gain values applied to the channels of the output audio comprise per-channel gains and global (system) gains. FIG. 4B illustrates calculation of per-channel and global gain values to determine audio output levels for the speaker feeds, under some embodiments. As shown in FIG. 4B, the input audio channels (e.g., 24 channels, though other numbers of channels are also possible) are input to a per-channel gain calculator 422 for the n channels and a global gain calculator 426 for the n channels. The per-channel gain calculator receives input parameters 424 from one or more sensors or components within the amplifier and listening environment, such as the fault detector 310 and monitor 314. For the embodiment shown, these input parameters 424 include: Tx, the per-channel amplification stage temperature; Vx, the per-channel voltage, Ix, the per-channel current; and Dx, the PWM duty cycle. The calculated per-channel gains Gx are then input to the global gain calculator 426 along with the audio input signal. The global gain calculator 426 receives input parameters 428 from the appropriate sensors and components. For the embodiment shown, these input parameters 424 include: Tp, the power-stage temperature; Ta, the ambient temperature; Vg, total voltage; and Ig, the total current. The input parameters 424 and 426 represent an example set of characteristics and other similar and appropriate parameters may be used depending on application, content, and environmental conditions.

As shown in FIG. 4B, the per-channel gain values Gx are combined with and applied to each corresponding channel of the audio input signal. The global gain value G from calculator 426 is then applied to the audio signal after the per-channel gains are applied to produce the speaker output channel feeds 430.

In an embodiment, gain adjustments are made according to the following algorithm (where Pr is the recommended power):

Gain Adjustments:
- If (Ig*Vg>Pr) then global gain (G) can be reduced until Ig*Vg<=Pr
  - This can also be done by analyzing the content and dropping Gx for the channels with high peaks.
  - Can also do both, i.e., dropping the per-channel gain on high-peak channels by a predefined acceptable amount and then dropping the overall gain until Pr Ta has inverse relation to G. There is a longer time constant to measure and act on this.
- Tp has an inverse relation on Pr; for example, the higher the temperature, the lower recommended power usage will be for the system.
- Ix*Vx (channel power) cannot exceed per-channel recommended power (Prx) and the gain (Gx) will be reduced until it does.
- Tx has an inverse relation to the per-channel recommended power (Prx).
- Dx may be an on/off switch for the channel.

The global gain G represents the power distribution for the system and takes into account ambient and amplifier temperatures and total voltage and current values. The per-channel gains take into account individual channel voltages, currents, and temperatures, as well as the PWM (pulse width modulated) duty cycles. In an embodiment, the power controller adjusts the per-channel gain values based on per-channel characteristics, power distribution characteristics, speaker health characteristics, and mains power supply characteristics.

With regard to speaker health monitoring, the Vx and Ix parameters can be used to provide the frequency response of a speaker (using Fourier transforms) and can help gauge the health of individual drivers. This is done by measuring impedance (Z=V/I) and verifying that it matches the expected curve for the speaker. A system can flag the speaker as "broken" for re-rendering or transmit a user alert, and/or turn off that speaker. Any alert or flag can then be transmitted to a system administrator, theatre staff or NOC (Network Operations Center) for further action. This signal can also be generated for non-speaker performance issues, such as rub and buzz, in a fixture or tile in the theatre.

Cinema Lighting Control

Figure 5:
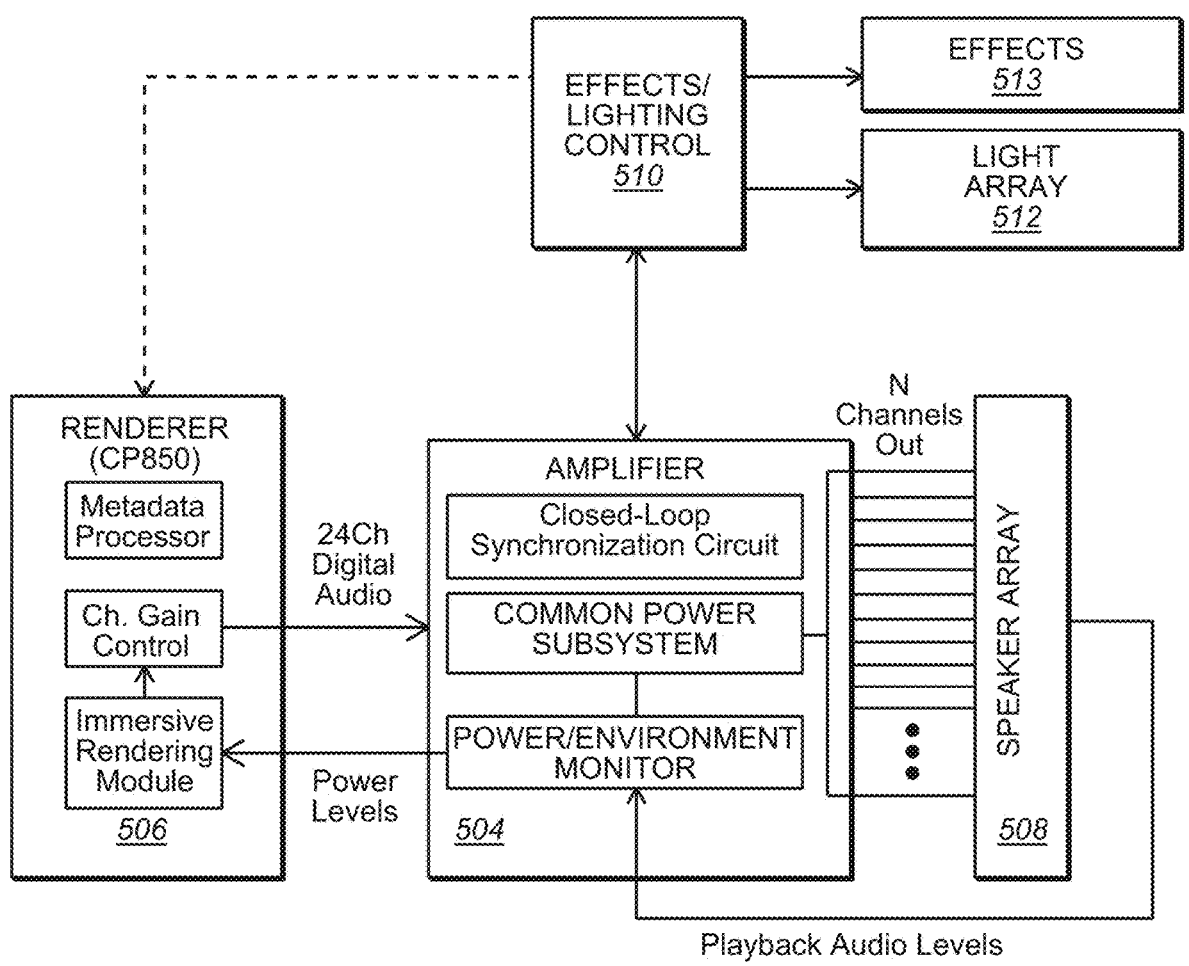
FIG. 5 illustrates a multi-channel amplifier operating in a rendering environment with lighting control, under some embodiments.

FIG. 5 illustrates a multi-channel amplifier operating in a rendering environment with lighting control, under some embodiments. As stated above, in an embodiment, the amplifier 504 is configured to work in conjunction with a compatible renderer 502 that provides the audio signals over the same number of channels (speaker feeds) output by the amplifier. Such a renderer may be a Dolby Atmos Cinema Processor CP850, or similar sound processor. This renderer plays back traditional 5.1 and 7.1 surround sound formats, as well as immersive audio content such as Dolby Atmos, which comprises audio objects and beds (channel-based audio). In general, audio objects can be considered as groups of sound elements that may be perceived to emanate from a particular physical location or locations in the listening environment. Such objects can be static (stationary) or dynamic (moving). Audio objects are controlled by metadata that defines the position of the sound at a given point in time, along with other functions. When objects are played back, they are rendered according to the positional metadata using the speakers that are present, rather than necessarily being output to a predefined channel. In an immersive audio decoder, the channels are sent directly to their associated speakers or down-mixed to an existing speaker set, and audio objects are rendered by the decoder in a flexible manner. The parametric source description associated with each object, such as a positional trajectory in 3D space, is taken as an input along with the number and position of speakers connected to the decoder. The renderer utilizes certain algorithms to distribute the audio associated with each object across the attached set of speakers. The authored spatial intent of each object is thus optimally presented over the specific speaker configuration that is present in the listening environment.

For the embodiment of FIG. 5, the renderer 502 comprises an immersive audio rendering module and channel gain control to transmit the appropriate digital audio signals to the amplifier 504. A metadata processor processes the corresponding parametric position/location/trajectory data for audio objects to generate the N-channel speaker feeds to the amplifier 504. The amplifier 504 includes a common power subsystem that provides power to all channels of speaker array 508, and sets the per-channel gain values based on the audio content and input from a monitor component that monitors power, environmental and operating conditions. The amplifier 504 may also include a closed-loop synchronization circuit to ensure that channels are clocked and switched at the same time to mitigate noise, beats, and other distortion.

In an embodiment, the amplifier also includes or is coupled to a lighting control unit 510 that uses the amplifiers power subsystem to power the lights 512 of the listening environment (e.g., cinema or theatre). The light array 512 may be any appropriate light or set of lights within the cinema, and may include direct (ceiling/wall) lights, ambient lights, floor path lights, seat lights, and the like. The lights may also be integrated into the speaker. The lights 512 may be coupled to the controller 510 through wired or wireless transmission means.

Metadata from the renderer 502 is received by the amplifier 504 and used to change the lights based on the content generated by the renderer. The metadata may include definitions that dictate light levels (color/intensity), or it may be standard immersive audio metadata that is interpreted by the lighting control unit 510 to generate the appropriate lighting signals to light array 512. The lighting control unit uses the metadata to automate and enhance the ambience of the listening environment. In an embodiment, the light array comprises ambient lights, while the main cinema lights are controlled separately, such as by the cinema operator. The ambient lights may be RGB LEDs that change color based on metadata from the exhibitors to enhance the content marketing, mood of the environment, or augment the audio by providing lighting cues in sync with the audio. The lighting intensity and colors can be changed based on the events of the showing, such as pre-show, intermission, and post-show. For example, the ambient color can be changed to that of the cinema brand or sponsor during these periods when the movie is not playing. The lighting can be synchronized to any music or messages playing in the background, as well. Using the common power subsystem of the amplifier, power is split between the speakers and the lights, so that during a light control period, power to the speakers may be reduced to accommodate powering the lights. Thus, when the ambient or main lights are on, most of the power delivered can be to the lights, and as the lights fade in preparation for pre-show trailers, power is shared and/or switched in the amplifier/speakers from lights to the audio. Light and audio power can be provided using the same two speaker wires, which helps greatly reduce the cost of installation, as separate power lines do not need to be run to the lights. It also greatly enhances automation, as metadata for the audio content can also be used to control the lights, thus ensuring synchronization between lights and sound, and balanced power distribution between the light and speaker feeds.

The lighting control unit 510 may also include an effects controller so that besides lights, other actuators or effects 513 can be controlled by the amplifier in sync with the audio content using the metadata that is either generated by the renderer or is transferred in the content. These include steam generators, water sprinklers, fans, smell/aroma generators, prop movements, LCD displays, holograms, and so on. Such actuators may be used when the amplifier is deployed in applications such as theme parks, simulators, and industrial/military installations.

Thermal Management

In an embodiment, the amplifier includes a thermal management system that consists of arrays of main and auxiliary fans, and temperature sensors across all channels, power supplies, and the chassis. Sensor outputs are collected, analyzed and fed back to a thermal controller which controls fan speed across the system. Included in this system is a predictive temperature control apparatus design to adjust future thermal profiles based on known or established environmental behaviors. For example, an adjustment can be made when a predicted temperature profile looks to be ramped beyond a set limit.

Figure 6:
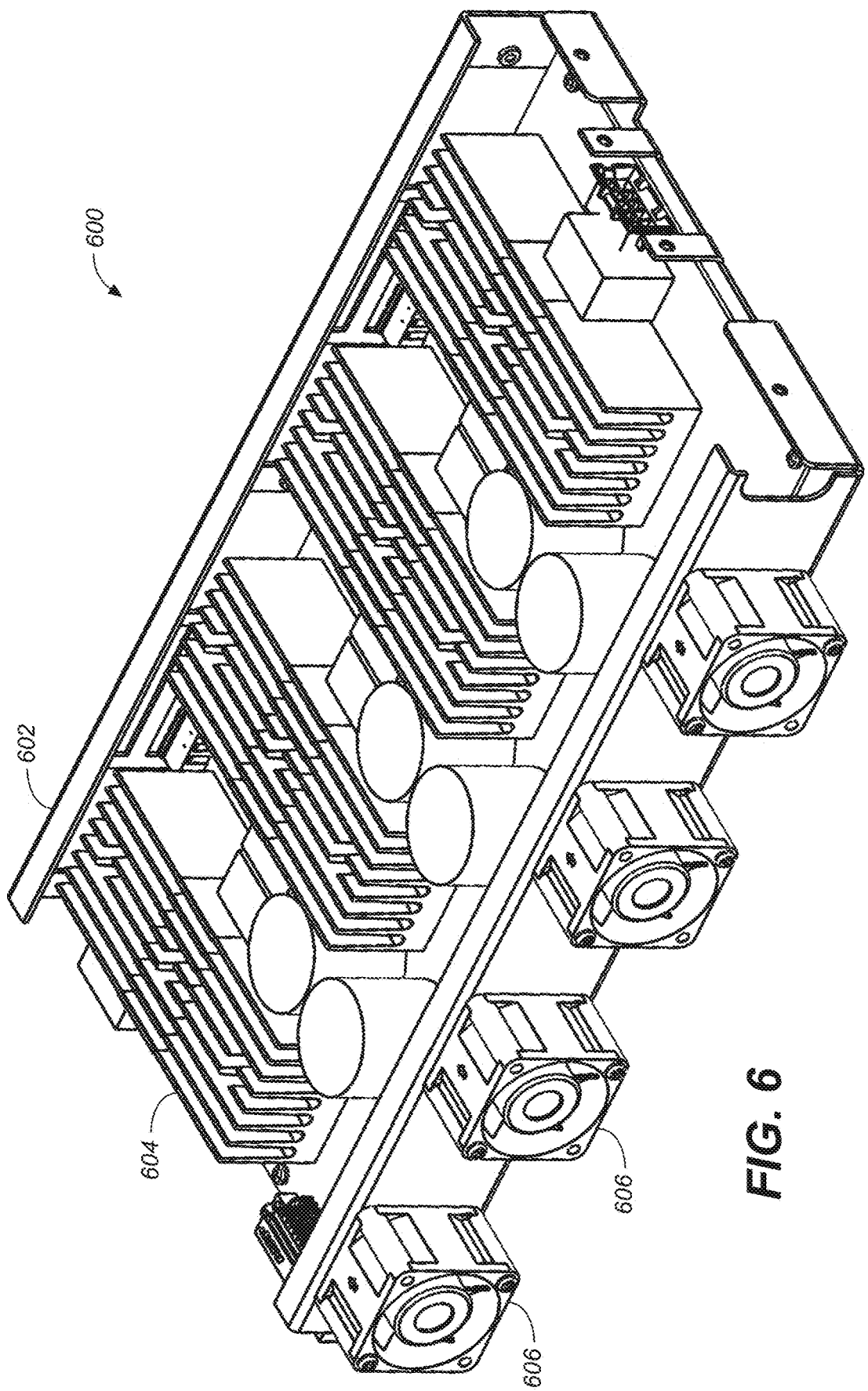
FIG. 6 is a perspective view of a multi-channel amplifier module under some embodiments.

FIG. 6 is a perspective view of a multi-channel amplifier module under some embodiments. For amplifier module 600, a unitary chassis 602 holds a number of individual amplifier circuits that finned heatsinks 604 for dissipation of heat. A number of fans 606 may be provided at appropriate locations of the chassis to drive air over and through the amplifier circuits out through vents in the chassis 602. Any appropriate number, size, and power of fans may be used depending on the configuration and power output of the amplifier circuits and overall amplifier module 600.

Figure 7:
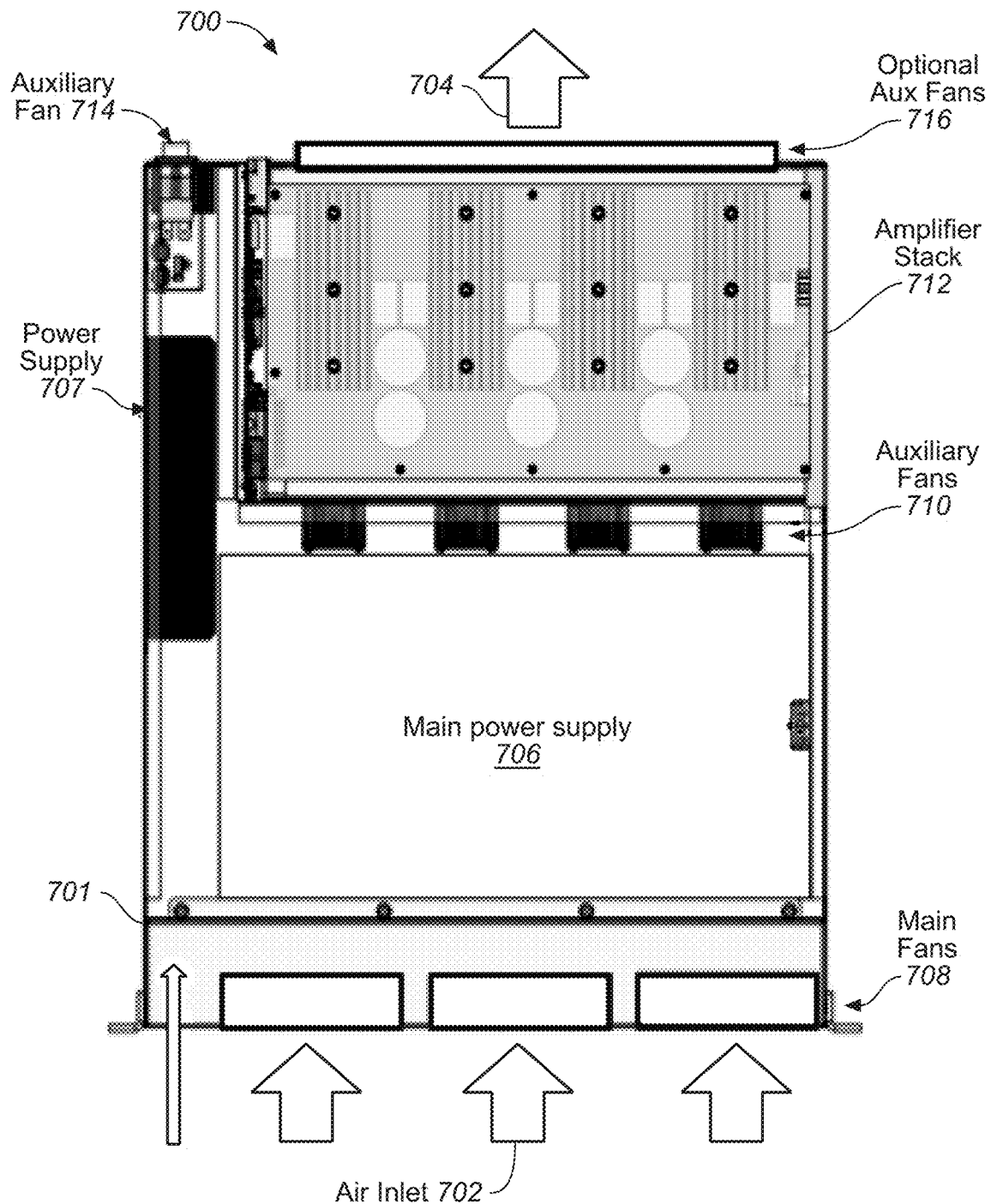
FIG. 7 illustrates components of an amplifier and airflow through the amplifier for thermal management, under some embodiments.

FIG. 7 illustrates components of an amplifier and airflow through the amplifier for thermal management, under some embodiments. As shown in FIG. 7, amplifier 700 includes an amplifier stack 712 (e.g., corresponding to amplifier module 600 in FIG. 6), a main power supply 706 and other power supplies 707. A mounting chassis 701 encloses these main components and provides a structure for mounting in a rack or other installation, as well as routing passages for air flow through the amplifier. Air flows in through air inlet 702 as drawn in by main fans 708 to flow over the main and other power supplies 706, 707. Auxiliary fans 710 (e.g., corresponding to fans 606 in FIG. 6) help drive the air over the amplifier stack 712 to vent out 704 through the front (and/or sides or other surfaces) of the amplifier. One or more sets of auxiliary or additional fans 714 and 716 may be provided to draw or drive air over other components or areas of the amplifier. The configuration of air vents, fans, and components for amplifier 700 are provided for purposes of illustration of possible embodiments, and other configurations are also possible.

In general, the thermal management system of the multi-channel amplifier 600 comprises speed control of the fans. The main, auxiliary and other fans may each be variable speed fans whose speed is controlled by a controller that monitors the thermal characteristics of the amplifier, which may include per-channel temperatures, power supply temperatures, internal chassis temperature, ambient temperature, and any other relevant temperatures. The fans may be set to operate at a default or minimum speed, and then increased to provide greater cooling if the sensors indicate that one or more of the relevant temperatures increases above a defined limit. Once the temperature or temperatures comprising the thermal profile is within a safe operating range, the speed of the fans may be decreased to minimize power consumption and reduce operating noise and vibration.

Figure 8:
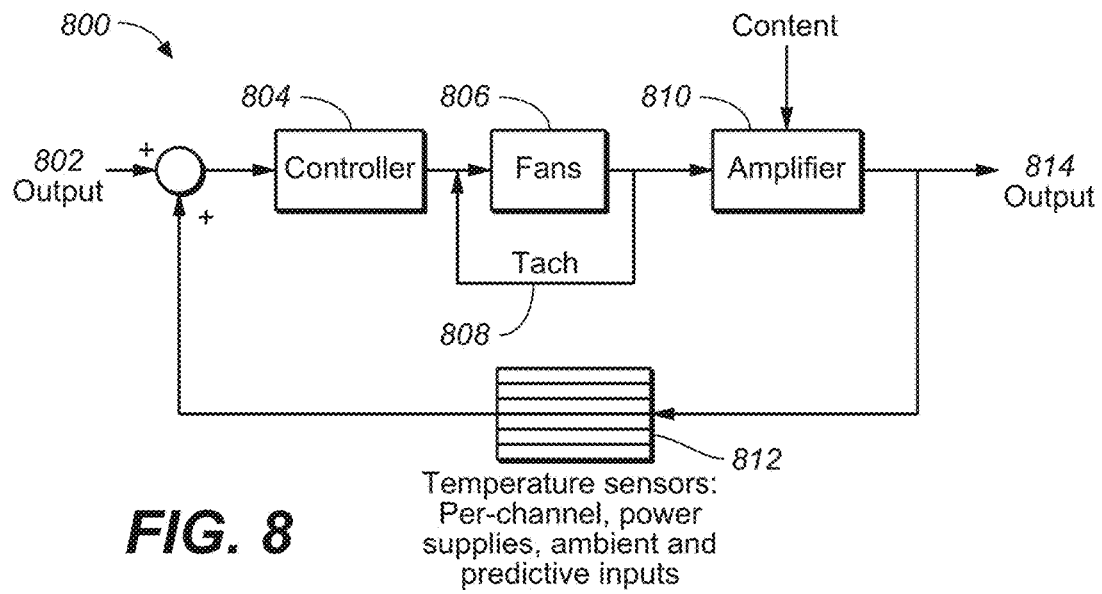
FIG. 8 illustrates a circuit for amplifier thermal management, under some embodiments.

FIG. 8 illustrates a circuit for amplifier thermal management, under some embodiments. As shown in FIG. 8, circuit 800 receives audio input, which is summed with a feedback signal from a number of temperature sensors 812. The sensors are located and configured to sense the relevant temperatures comprising the thermal profile of the amplifier, such as per-channel temperature, power supply temperature, ambient temperature, and any predictive inputs. The signal is then passed to a controller unit 804, which is coupled to the fans 806. The fans are controlled by one or more tachometers 808 for speed control over individual fans or arrays of fans within the amplifier. The audio content is then transmitted through amplifier stage 810 to form the audio output 814. The audio output comprises the individual channels (e.g., 24 channels) of the amplifier, which also provide the input to at least some of the sensors 812.

Figure 9:
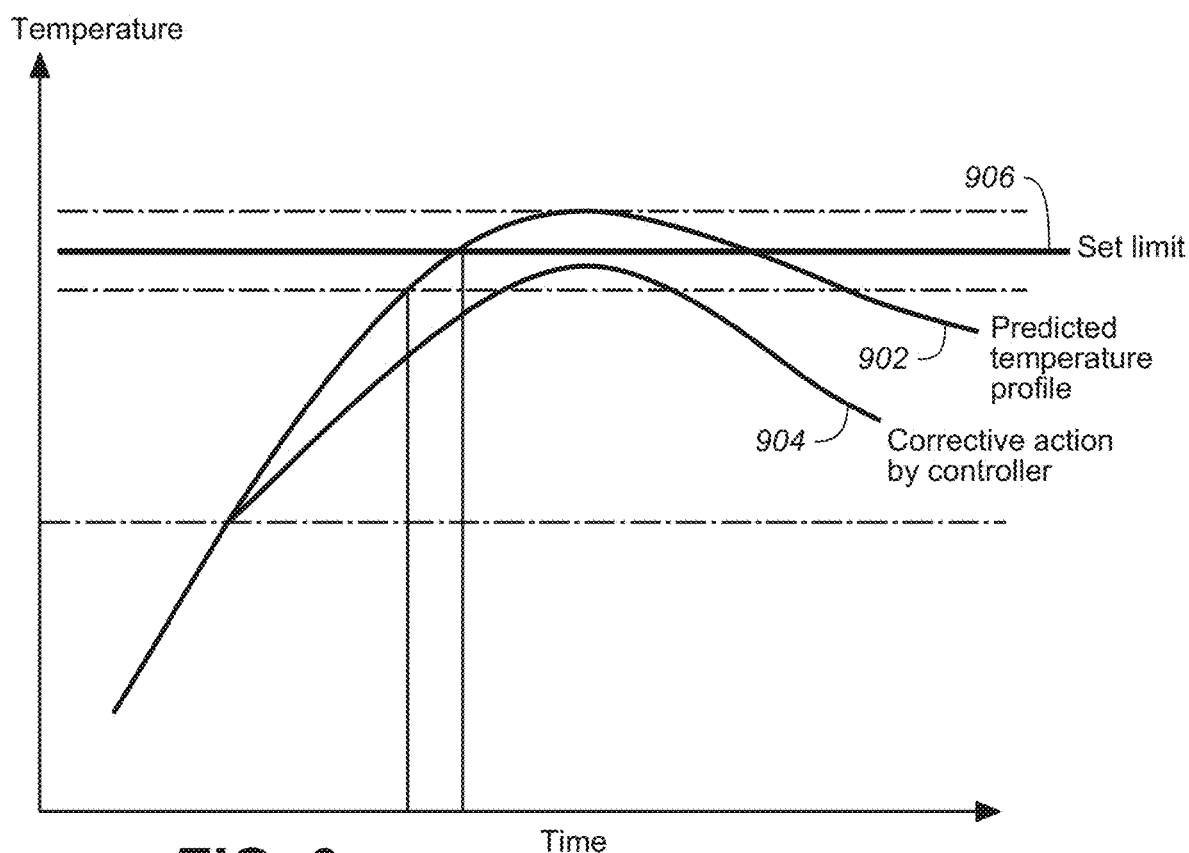
FIG. 9 illustrates an example temperature profile curve for a multi-channel amplifier, under some embodiments.

As shown in FIG. 8, a predictive temperature control component may be used to adjust future thermal profiles based on known or established environmental behaviors. For example, an adjustment can be made when a temperature profile is predicted to increase beyond a set limit. FIG. 9 illustrates an example temperature profile curve for a multi-channel amplifier, under some embodiments. The plot of FIG. 9 shows a relevant temperature measurement of the amplifier over time. A limit 906 is defined at a set temperature to define the highest acceptable operating temperature of the amplifier. A measured or predicted temperature profile 902 plots the temperature as it rises and falls over time. If the controller 804 determines, predicts or is provided sensor data that indicates that the temperature profile plot will or has exceeded the set limit 906, the fans are actuated or accelerated to lower the temperature so that it remains below the limit. This fan control constitutes the corrective action performed by the controller and yields the corrective temperature profile 904. In this manner, the thermal conditions of the amplifier can be controlled. FIG. 9 may represent an overall internal temperature of the amplifier or it may represent any one of the relevant temperatures comprising the thermal profile, i.e., individual channel temperature, power supply temperature, ambient temperature, etc.

Front-Panel LED Messaging

Figure 10A:
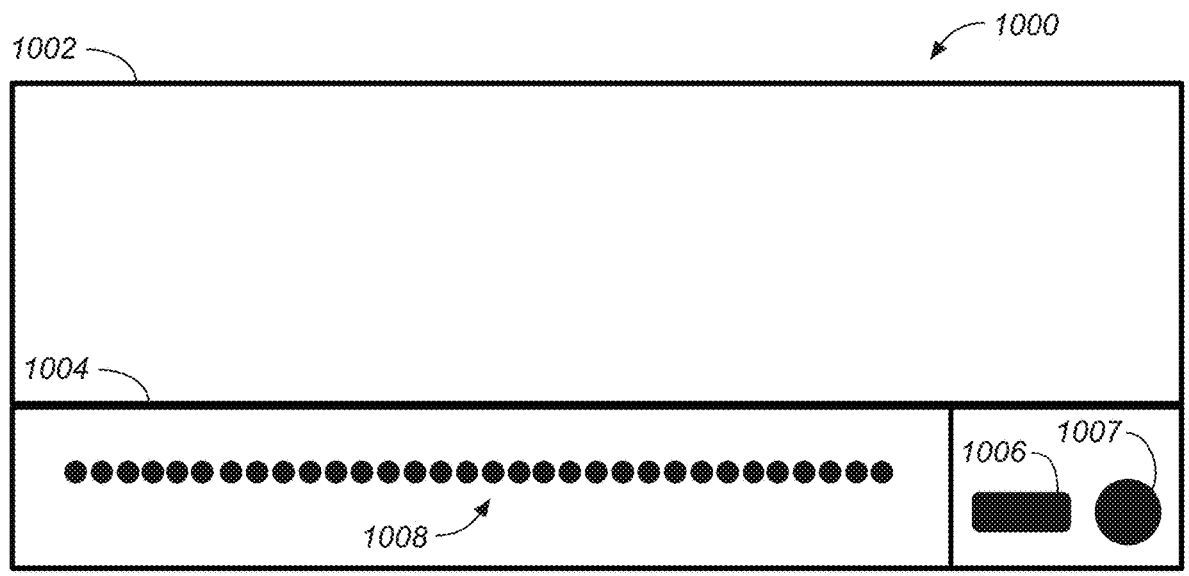
FIG. 10A illustrates a front panel for use with a multi-channel amplifier and including an LED array under some embodiments.

Embodiments of the multi-channel amplifier 206 of FIG. 2A may include a front panel that includes one or more arrays of LEDs (or similar lights) that message various different operational and/or failure conditions through pre-defined light sequences. The light sequences may be unique combinations of color, timing, flashing, or sequence patterns. FIG. 10A illustrates a front panel for use with a multi-channel amplifier and including an LED array under some embodiments. As shown in FIG. 10A, front panel 1000 comprises different portions including a perforated portion 1002 that covers a majority of the front portion of the amplifier and provides protection as well as ventilation to allow heat to escape from the interior of the amplifier. The bottom portion 1004 of the front panel may include an I/O portion that provides one or more connectors or ports 1006 to connect auxiliary devices, such as USB or other similar interface devices, one or more input controls such as main power button 1007 may also be provided. A second part of the bottom portion provides a number of LED lights 1008 arranged in a straight linear array. The size and number of LED lights may be adapted depending on system configuration, front panel space, and so on. The LED lights may be single color, but are preferably RGB (red/green/blue) LEDs that individually display different colors. They can be of any shape (e.g., round, rectangle, triangle) depending on design and configuration preference.

The number of individual LEDs or light elements in array 1008 can vary depending on the number of channels the amplifier provides, and/or the number that are monitored in the amplifier. For a high channel count amplifier, channels may be combined for representation by a single LED to reduce the number of LEDs required and prevent the need for over-elaborate or hard-to-see messaging sequences. For the example embodiment shown in FIG. 10A, 32 individual LEDs are provided. These can represent one LED per channel in a 32-channel amplifier, or one LED each for a number of channels of the amplifier. If the amplifier is a 160-channel amplifier, each LED represents five channels.

The LEDs may be arranged in any appropriate array, such as a single horizontal line, two or more lines, vertical lines, diagonal lines, and so on. Under a preferred embodiment, the arrays are arranged as a single linear array, as shown. The lighting sequence described in greater detail below will be described with reference to affecting an animation across this linear array, but it should be noted that similar sequences can be adopted for other possible array configurations. The LEDs may be grouped such as into four groups of 8 LEDs each for 32-channels, or any other grouping that is visually appealing and appropriate.

Figure 10B:
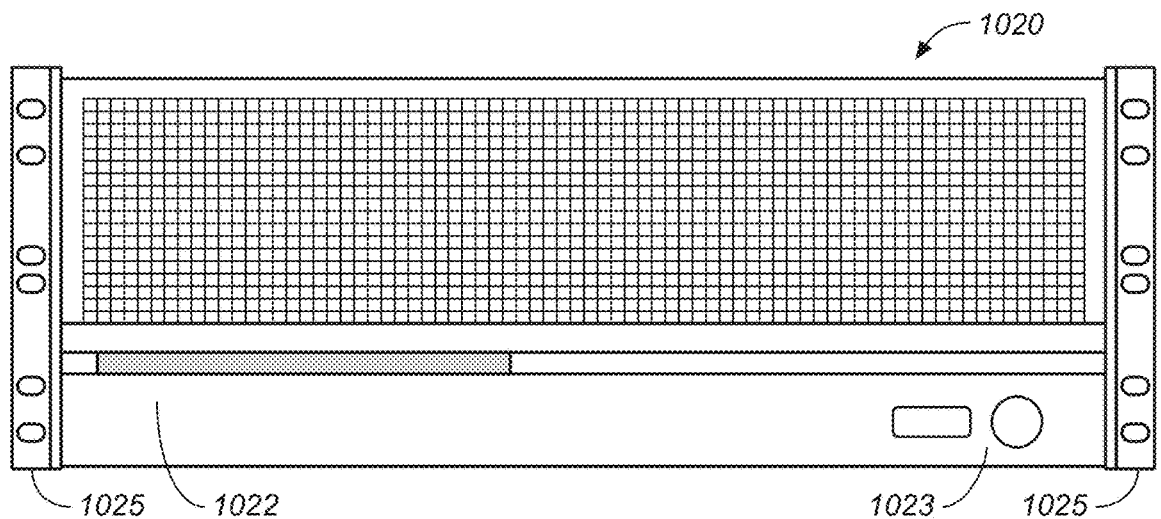
FIG. 10B shows a front panel for an amplifier having a linear LED array, under an example embodiment.

FIG. 10B illustrates a front-panel for an amplifier having an LED array under an example embodiment for a rack-mountable amplifier. As shown in FIG. 10B, front panel 1020 includes the linear array of LEDs 1022 arranged in a relatively tight line of LEDs, which may be round, rectangular or any shape. In an embodiment, the LEDs nominally display the signal strength per channel and then light according to an animation sequence in the event of any defined fault or other operational condition. To provide a smooth animation, the LEDs are typically located closely together to provide a "streaming" light effect. Alternatively, the LEDs may be grouped to show different sets of channels for ease of channel distinction. Other switches or interfaces 1023 may also be provided, each of which may have their own associated LEDs or lights.

Figure 10C:
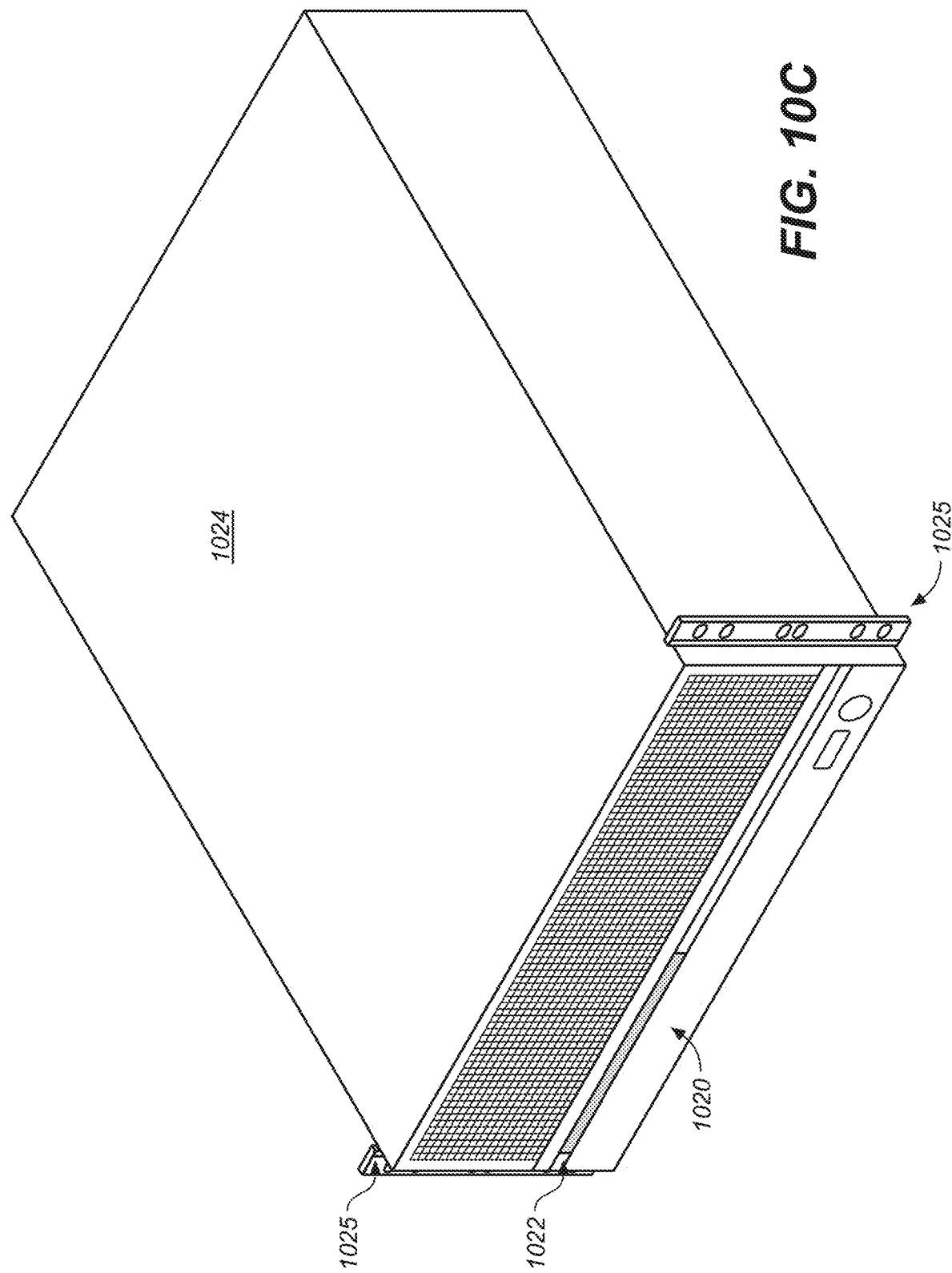
FIG. 10C is a perspective view of the front panel of FIG. 10B as mounted on an actual amplifier unit.

FIG. 10C is a perspective view of the front panel of FIG. 10B as mounted on an actual amplifier unit. As shown in FIG. 10C, front panel 1020 is mounted to a front surface of amplifier 1024 and provides mounting flanges 1025 and hardware for rack mount installation. The LED array 1022 is positioned in an appropriate location of the front panel, and may be flush to the surface of the front panel, or placed in an inset portion or strip of the panel. Reflective material or lenses may be used to enhance or amplify the light effect or provide a glow when the LEDs light.

Figures 10D, 10E:
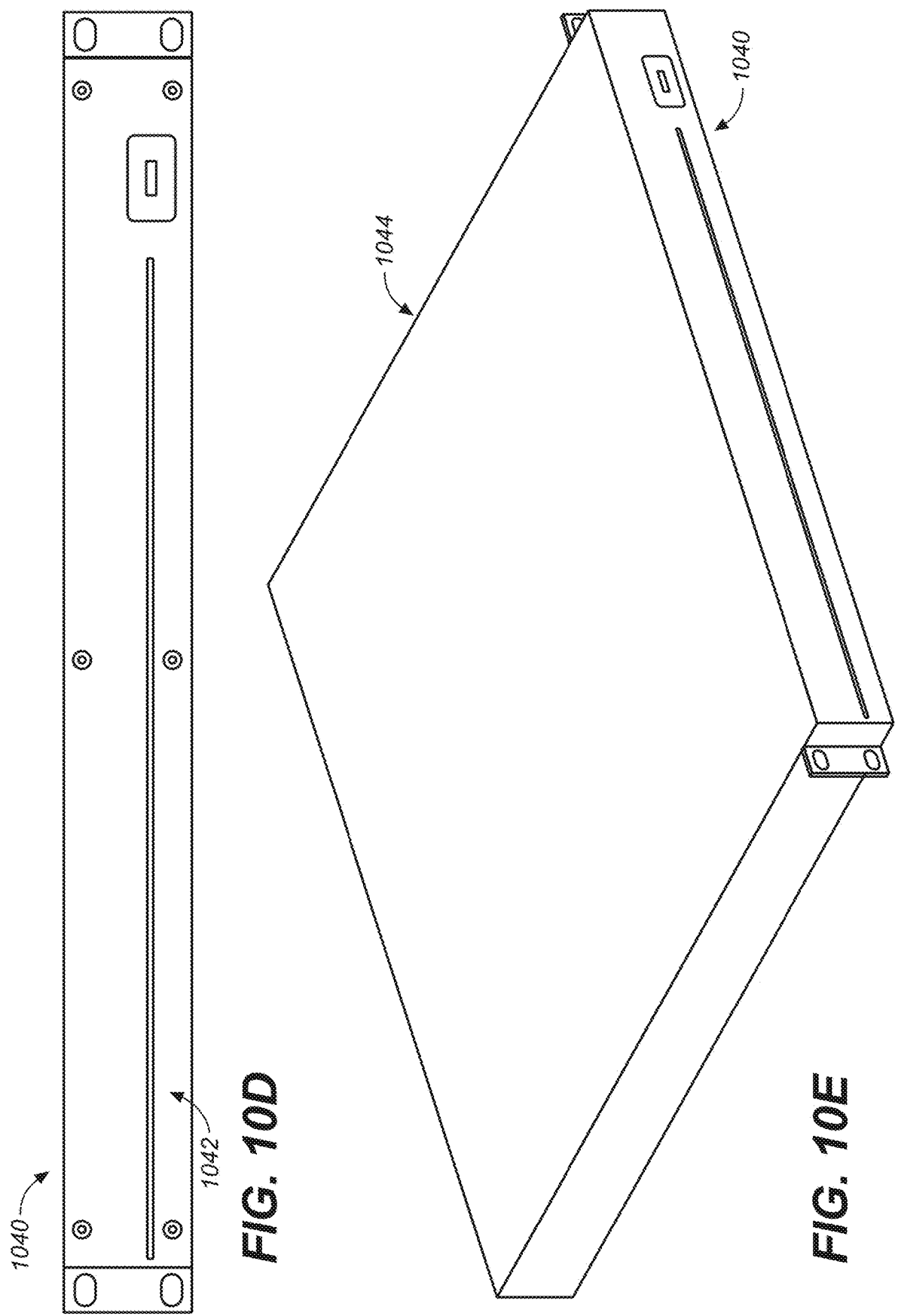
FIG. 10D shows a front panel for an amplifier having a linear LED array, under an alternative example embodiment.
FIG. 10E is a perspective view of the front panel of FIG. 10D as mounted on an actual amplifier unit.

The amplifier may be implemented as a full-height, half-height rackmount or standalone unit. The front panel may thus be of any appropriate size. FIG. 10D shows a front panel for an amplifier having a linear LED array, under an alternative example embodiment. For this embodiment, the front panel 1040 is mounted to a slim-line amplifier, or even a pre-amplifier unit or other sound processing unit that sends and receives signals to a separate audio or power amplifier unit. The LED array 1042 is shown as being an array that is located along substantially the entire width of the panel, though embodiments are not so limited. FIG. 10E is a perspective view of the front panel 1040 of FIG. 10D as mounted on an actual amplifier unit 1044. FIGS. 10D and 10E illustrates just one alternative embodiment of the front panel and associated amplifier unit, and many other configurations are also possible.

It should be noted that any of the shapes that are shown in FIGS. 10A-10E and any of the other figures may be implemented or designed with alternate appearances that nevertheless perform the same function.

In an embodiment, the LED array is coupled to a control unit that takes inputs from sensors in the amplifier that monitor operational and fault conditions, such as thermal conditions, signal level, channel health/failure, cable connectivity, current draw, and other similar operational characteristics. Normal operation may be indicated by the lights displaying a default light pattern, such as each channel or channel group LED showing output signal strength as a function of LED intensity and/or color. In the event of a failure condition where the amplifier needs the attention of an operator, such as one who is a far-away operator and making the rounds for many amps, the control unit animates the LEDs in unison to send out a light pattern (e.g., S.O.S. signal) that can be easily seen from a distance.

The control unit is programmed with various different lighting patterns that cause the front panel LED array user interface to display visual cues that convey certain status information, including: (1) positive, normal operation, (2) error states, and (3) warnings and alerts. Various different operational modes can be shown through the appropriate lighting patterns, such as: amplifier boot-up (initiated, in progress, complete states), stand-by mode engaged, normal operational state, and system shut-down, among other modes. FIG. 11 is a table that illustrates various modes to be indicated through corresponding display patterns, under some embodiments. Table 1100 shows some example operating states and conditions that may be displayed through LED lighting patterns to inform/alert the operator of normal and abnormal operation. The displayed conditions include amplifier and channel status and each has a unique corresponding display pattern to distinguish it from the other conditions. Example patterns are shown for the enumerated conditions. FIG. 11 is provided for example only, and many other conditions and lighting patterns are possible.

Through the messaging light sequences, normal operation (e.g., startup, standby, normal signal presence, shutdown) is typically indicated by what may be considered conventional display patterns, while abnormal conditions (e.g., channel overload, channel failure, system failure) are indicated by display patterns signifying error and warning messages to which the user (operator) should pay attention and potentially take action to rectify.

In an embodiment, the display patterns utilize the color range of each RGB LED and the spacing of the LEDs in the array to create a visual representation of an animation through sweeping scans of colored light. Various different parameters are programmed to produce the appropriate display pattern, including, but not limited to:

1. LED Color
2. LED Intensity
3. Start Point/End Point
4. Sweep Speed
5. Sweep Sequencing
6. LED or Array Flashing/Pulsing The sweep pattern can be generated by lighting immediately contiguous LEDs or it may skip certain LEDs to create an interpolated sweep pattern. To create certain animation effects, various different LED characteristics could be varied, such as color duration, interpolation, and so on. For example, a sweep could start fast and slow down as it approaches the failed channel, and/or it could change color, or the interval could be changed so that every other LED is lighted at the beginning of the sweep, while every LED is lighted at a brighter intensity toward the end of the sweep, and any other possible variation.

The display patterns combine and alter any one or more of these LED parameters to provide a unique pattern for each condition by using visual and timing properties that can be easily discerned at a glance, even from a distance. In general, positive messages such as normal operation are intended to be clear yet more subdued in their visual presentation; consequently, they may be programed to be "calmer" in how they animate (e.g., steady single color light). In contrast, negative messages for errors and warnings are designed to behave in a more stark and attention-grabbing manner, such as through bright or discordant colors or effects such as flashing, and so on.

Any appropriate color or color combination can be used depending on user preference, and certain known conventions may be adopted, such as green or blue for good condition, yellow for warning, red for bad conditions, and so on. The use of RGB LEDs allows for an increase the "word resolution" of the messaging that is conveyed for each channel. For example, 16 different levels of color saturation and luminosity in each channel LED may be used to indicate the signal presence level of each individual channel during normal operation. This signaling can then be interrupted and re-purposed to alert the user of error states or channel failures that need fixing.

Figure 12A:
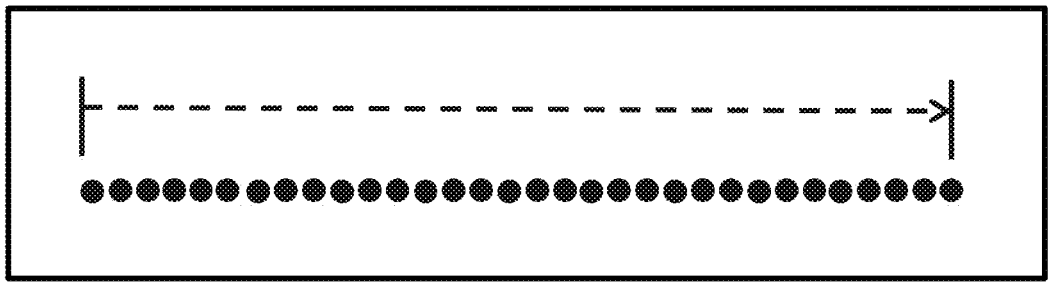
FIGS. 12A, 12B, and 12C illustrate a sweep of the LED array to pinpoint specific channels to a user, under some example embodiments.
Figure 12B:
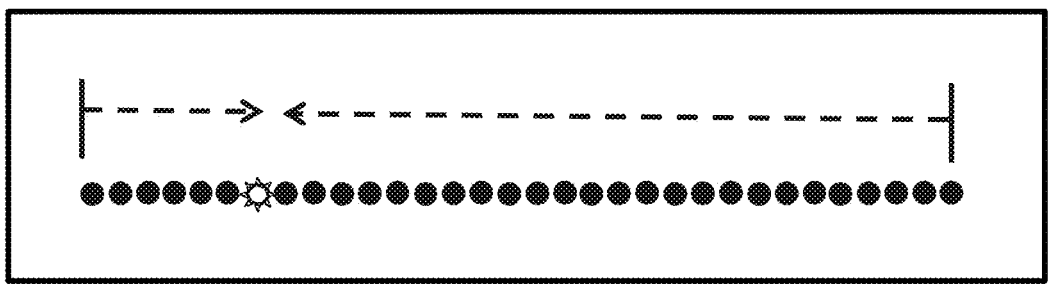
Figure 12C:
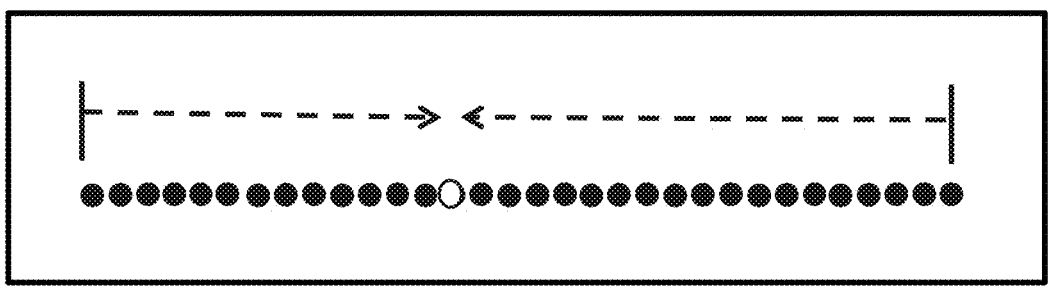

In an embodiment, the LED array is used to provide immediate status information for individual channels or channel groups. This is accomplished through a sweep function that uses motion across the LED array (x-axis) to "point" at a particular channel or group of channels. FIGS. 12A-C illustrate a sweep of the LED array to pinpoint specific channels to a user. FIG. 12A illustrates consecutive lighting of LEDS in the array to show an animation that sweeps left to right across the face of the amplifier. The sweep pattern can be performed from either side to the other side, or from both sides in to point to a particular channel. Thus, FIG. 12B shows the LEDs sweeping inward to point to one channel, while FIG. 12C shows the LEDs sweeping inward to point to another channel. As each LED lights in sequence it can either stay on or turn off, and the channel that is pointed to can be displayed in a highly contrasting color or as a flashing LED.

In a high-channel count cinema amplifier, it is possible that multiple channels may encounter fault problems. The LED messaging system provides an effective means to quickly see exactly which channels are faulty. If only one channel is faulty, the left and right sides of the array animation converge on the faulty channel. If more than one channel is faulty, the left and right sides of the animation converge on the center point of the LED array and then each faulty channel blinks. Alternatively, the animation can converge on each faulty channel LED in quick sequence, with all faulty channel LED's persisting in a blinking or contrasting color state.

As shown in FIG. 11, many different display or lighting sequences (animations) can be programmed for different operating and fault condition states. Some example animations include:

1. System Bootup: LEDs light up sequentially in a defined color (e.g., blue).
2. System Standby: LEDs dim sequentially or fade out together and power light goes on.
3. Amp Shutdown: All LEDs flash to red (or other color) then fade out.
4. Amp Failure: LEDs continuously ripple in red (or other) color.
5. Channel(s) Shutdown: Animation sequence points to faulty LEDs.
6. Signal Presence: LEDs glow according to strength and change color when clipping (e.g., blue to white).

These are just some examples of amplifier state and animation combinations, and any other appropriate messaging animations for any appropriate operational mode or fault condition can be used.

The use of the sweeping LED animation shown in FIGS. 12A-C represent display patterns used for significant error states. It is a unique, attention-grabbing physical messaging system and user experience that works both at close proximity and from a distance. It essentially acts as an LED semaphore system that marshals all the single channel LEDs into collections with a common purpose of pointing at something, sharing a behavior, and then transitioning from this strong visual indicator to animations of individual LEDs that pinpoint the actual channels at fault (and indicate the type of fault). As such these "smart" LED animations and transitions provide focused and relevant information. Thus, the LEDs provide a front panel interface that alerts a user that the amplifier needs attention by animating the LEDs in unison to send out an alert or S.O.S. signal that can be easily seen from a distance.

The animations may be looped so that faulty conditions are continuously displayed until user action is taken. Alternatively, they may be displayed for a set period of time before another type of alert is provided, such as a sounded alarm, text message, automated phone call, GUI message, or other similar type of remote alarm.

In an embodiment, this "arm and hand waving" call to attention is programmed as one or more display patterns that are programmed into a software executable provided by the control unit coupled to the LED array, or programmed into an FPGA (or similar device) controlling the LEDs, or hardwired into the LED control circuitry. In an embodiment of the multi-channel amplifier embodiment, the LED control program can be invoked by the amplifier main software when sending instructions and values to the LEDs. The display patterns utilize certain LED functions to provide corresponding the animations and transitions. These include: color and light intensity, such that by using RGB LEDs, the system creates distinct and simple "messages" constructed with a) light intensity, b) blinking frequencies, and c) color variations. The program can independently animate red, green, and blue start and end values (e.g., from 0 to 65535) for each LED, as well as for each transition of any given LED. The system creates the sensation of movement by successively turning contiguous LEDs on and off across the x-axis to "point" to one or more channels that need attention, as shown in FIGS. 12B and 12C.

The program also provides certain timing algorithms. For example, if animation A starts from the left-most LED, and animation B simultaneously starts from the right-most LED, and they share the same ending point across the x-axis (i.e., to point to a specific channel), the timing algorithms calculate the duration of each transition so that the two animations reach the same destination at the same time. The system allows any number of LEDs to form a collection of LEDs, where each LED collection has its own behavior as a group. The system can trigger two collections at once. For individual transitions, the system allows LEDs to switch from "array signaling" through collections to individual "pinpoint mode." This allows the system to transition to individual LEDs, each of which may have their own animations to indicate their current condition. The system also features successive and delayed timing. Collections and transitions can be placed on a virtual timeline to create programmatically complex yet visually simple and rich animations. The system can offset the start of one collection relative to another to create special visual effects such as quick blooming and fading out slowly (i.e., akin to keyframe interpolation).

In an embodiment, the amplifier is designed to monitor itself and send the necessary messages to the front panel LED system to display the appropriate "messages" and, in the case of major errors, loop those animations and transitions until the error conditions have been resolved. Specific display patterns may be provided by the system as default settings, or they may be user configurable to at least some degree, such as in choice of color, animation speeds, etc.

With respect to the LED messaging system, in general, a display pattern is a collection of animations and array sequences; where an array sequence is a set of start/end indices and values, animations, durations, and timing offsets (i.e., when to start). An animation is a collection of transitions, where a transition specifies individual LED properties, interpolations, and delays. The following example data elements can be used to illustrate the structure of a display pattern, under an embodiment:

---
Transition_LED (property, start/end, duration, interpolation, delay)
 → Property (LED color, LED brightness)
Animation (collection of transitions)
Array Sequence (start/end animation, total duration, scale duration)
Display Pattern (animation, array sequence
---

Figure 13:
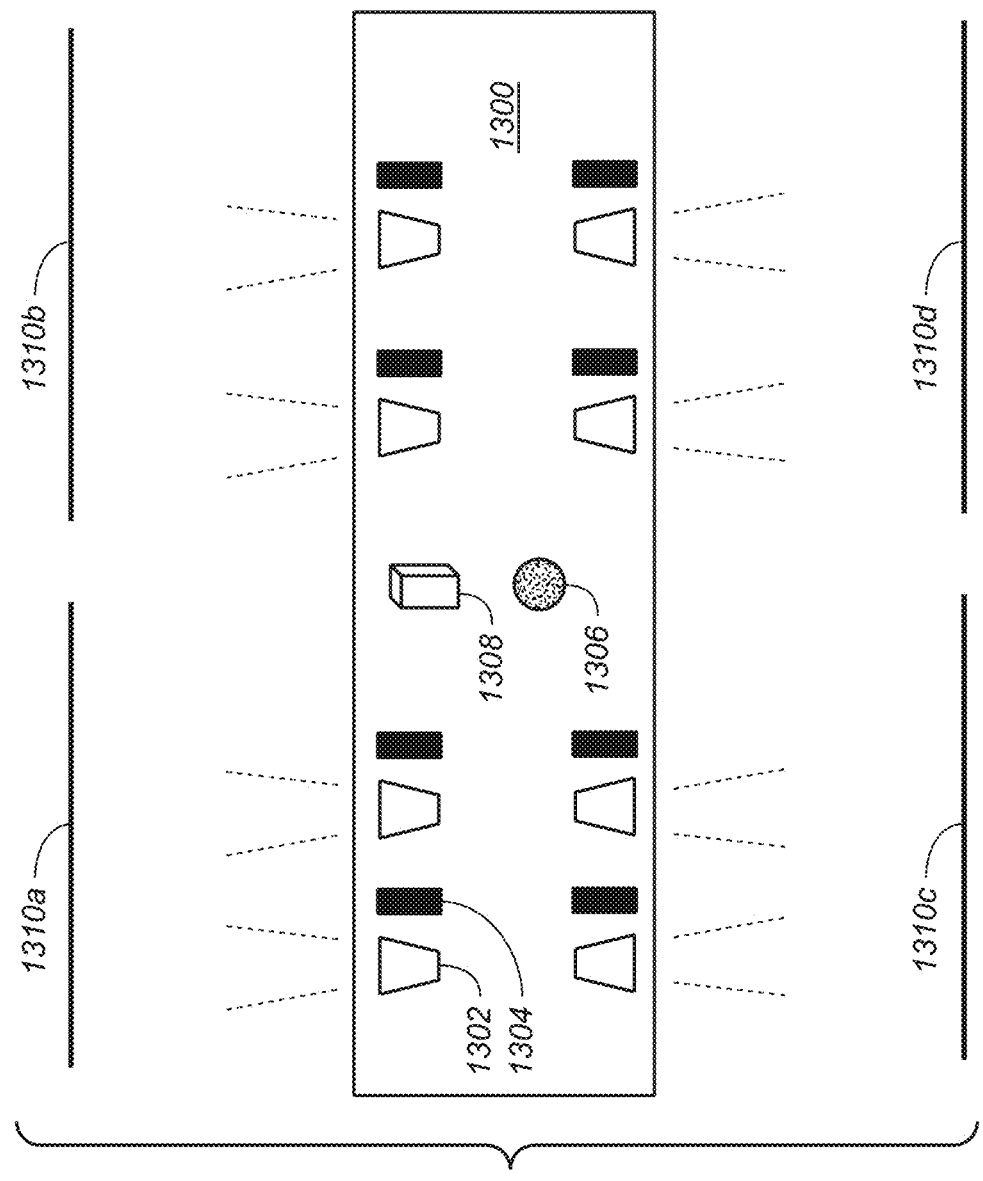
FIG. 13 illustrates deployment of multi-channel amplifiers in a digital cinema environment with front-panel LED messaging, under an embodiment.

In an embodiment, the multi-channel amplifier and front panel LED messaging system can be used in a digital cinema environment in which an operator is typically far away from the equipment rack holding the multiple amplifiers used in the overall system. Such distances can be up to 30 feet or more, as compared to the typical six-foot distance typically encountered in older digital systems built around small control booths. The messaging system allows the operator to see the functioning of each amplifier from a distance and while walking around the various equipment racks. FIG. 13 illustrates deployment of multi-channel amplifiers in a digital cinema environment with front-panel LED messaging, under an embodiment. As shown in FIG. 13, a digital cinema room 1300 contains a number of projectors 1302, each having a respective rack of amplifiers 1304 and projecting against respective screens labeled 1310a to 1310d. Many different cinema configurations are possible, and depending on the cinema, the room 1300 can be quite large (e.g., on the order of 60 to 90 feet wide) depending on the number of projectors and screens. Usually a single operator 1306 monitors and operates all of the digital projectors, and thus needs to watch the equipment racks for each projector. In present multi-channel systems, the entire number of audio channels operating at once can be extremely high if all or most projectors operate at the same time. A fault in any one channel, must therefore be identified quickly and accurately to ensure smooth operation. The front panel LED messaging system provides a means to communicate the operating health of each amplifier channel in an effective manner and over great distances in a crowded equipment environment.

The messaging system is configured to provide different levels of messaging depending on the proximity of the user 1306 to the amplifier. As described above, certain "arm waving" display messages are programmed to project error messages for messaging over a distance. For close proximity, the display messages for normal operation states (e.g., where audio is being played back into the auditorium normally), the signal presence ranges from a low signal indicator (e.g., blue light) to a higher signal, audio signal with limit in effect (e.g., white light). The display message is programmed such that these normal conditions do not draw too much attention to themselves from a distance, as they are optimized for reads at closer proximity, and appear as a softer glow from a distance, thus allowing error conditions to be readily distinguished over that distance.

Figure 14:
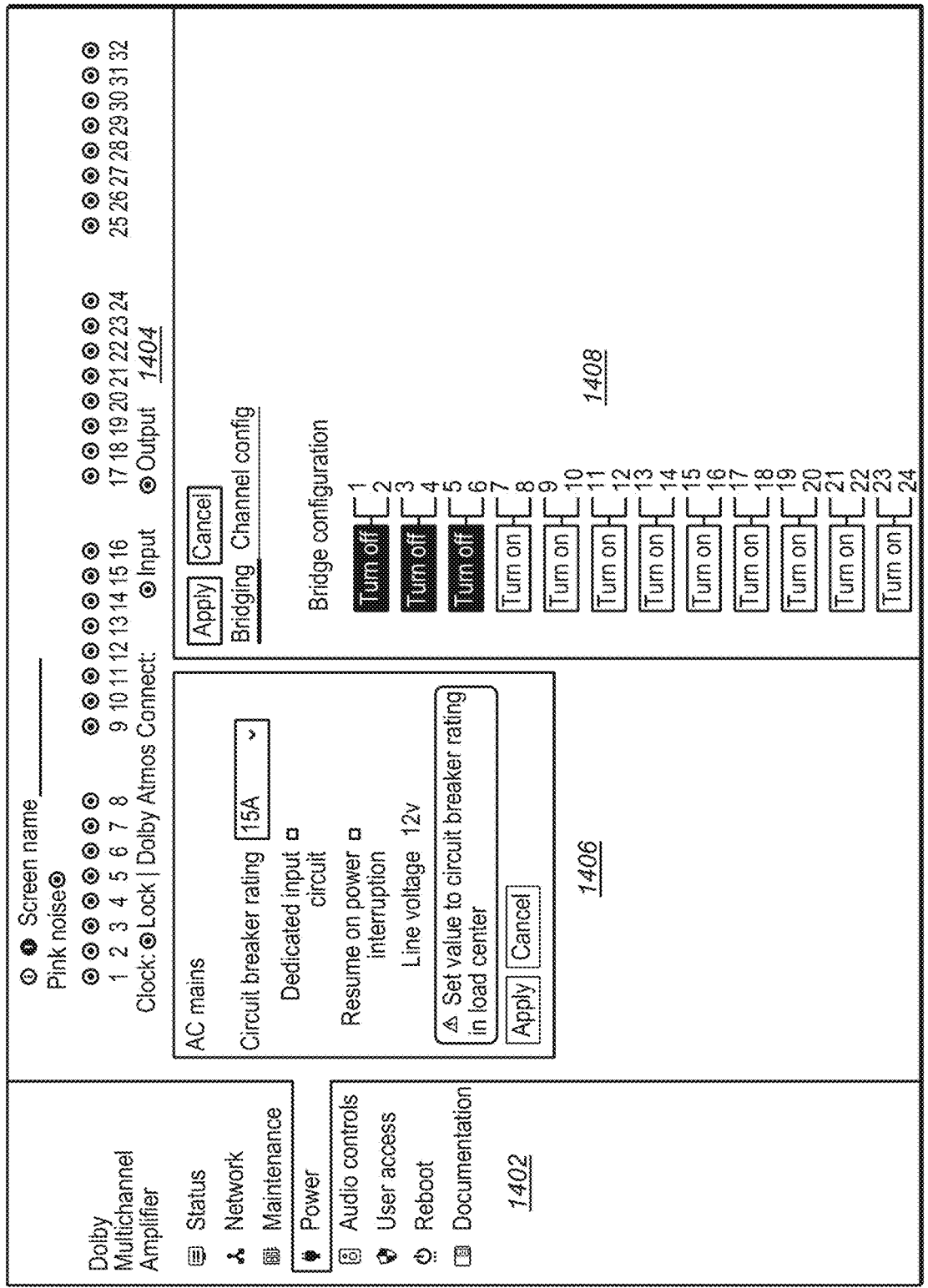
FIG. 14 illustrates an example graphical user interface display for an LED messaging system for a multi-channel amplifier, under some embodiments.

In an embodiment, the user 1306 may control the operation of the projectors and amplifiers through a computer 1308. In an embodiment, the LED messaging system is replicated through the graphical user interface (GUI) of the control computer 1308 so that amplifier channel status and general operating conditions are presented to the user readily through a central user interface that is usually right in front of the user. The computer 1308 may be embodied in a client or server computer located in the cinema, venue, or control room 1300, or it may be embodied as a laptop or notebook computer carried by the user, or even a portable device, such as a tablet or mobile phone. As shown in FIG. 14, UI display 1400 has a number of display areas to provide information and input areas for various aspects of amplifier operation and system configuration. For the example of FIG. 14, the amplifier control area 1404 shows the LED indicator lights for each channel and the light array 1404 shown in the UI corresponds to the front panel LED arrays 1012 for an amplifier. In an embodiment, the UI receives the same LED control feeds as the front panel, and thus lights up simultaneously and in accordance with the LEDs on the front panel itself. The LED display 1404 may correspond to the layout of the actual front panel LED array, or it may be different. For the example shown in FIG. 14, the LEDs are numbered by channel and grouped in four groups of eight channels (for 32 total channels). This facilitates easy location of a specific amplifier card within a rack mount that may include four cards for the 32 channels. Any other UI layout can be used depending on the amplifier hardware layout within the rack or racks.

Additional display areas of the UI may be provided for other aspects of the amplifier, such as a AC mains area 1406 that displays a status of the power supply condition, with appropriate warning of instruction messages. Amplifier configuration parameters may also be displayed such as in area 1408, which shows a bridge configuration for the channels that groups or bridges certain channels together. Other configuration parameters and associated input controls and status indicators can also be provided, such as channel/speaker assignments, channel configurations, and so on. The UI of FIG. 14 is intended to be for purposes of illustration only, and many other UI screens may be provided with different display areas and formats.

The UI 1400 may be configured to display configuration and operating information for one amplifier or for multiple amplifiers. For multiple amplifiers, all of the LED front panel displays may be shown on one UI screen so that an operator watching the UI screen can see the status of each amplifier without needing to scan or walk across the cinema environment. Other display areas in the UI may be provided for overall cinema operation including projector control and amplifier control.

In an embodiment, the control unit controlling the LED arrays for each amplifier transmits the LED control signals to the computer 1308 either through wired or wireless communication links.

Although examples of the front panel messaging system have been described with respect to implementation through LED light arrays, it should be understood that embodiments are not so limited. Alternatively, the light array for condition messaging may be implemented through an LCD (liquid crystal display) screen that is configured to display pixels or other display elements in the form of lights or sequenced image objects that can provide the same type of light messaging.

Multi-Phase Power Supply

For the embodiment of the amplifier 504 illustrated in FIG. 5, all of the output channels (e.g., 24 or 36 channels) are driven by a single power subsystem or power supply. Embodiments include a multi-phase power supply design that incorporates dual or triple redundancy to prevent a power supply failure condition from knocking out all of the channels.

Figure 15:
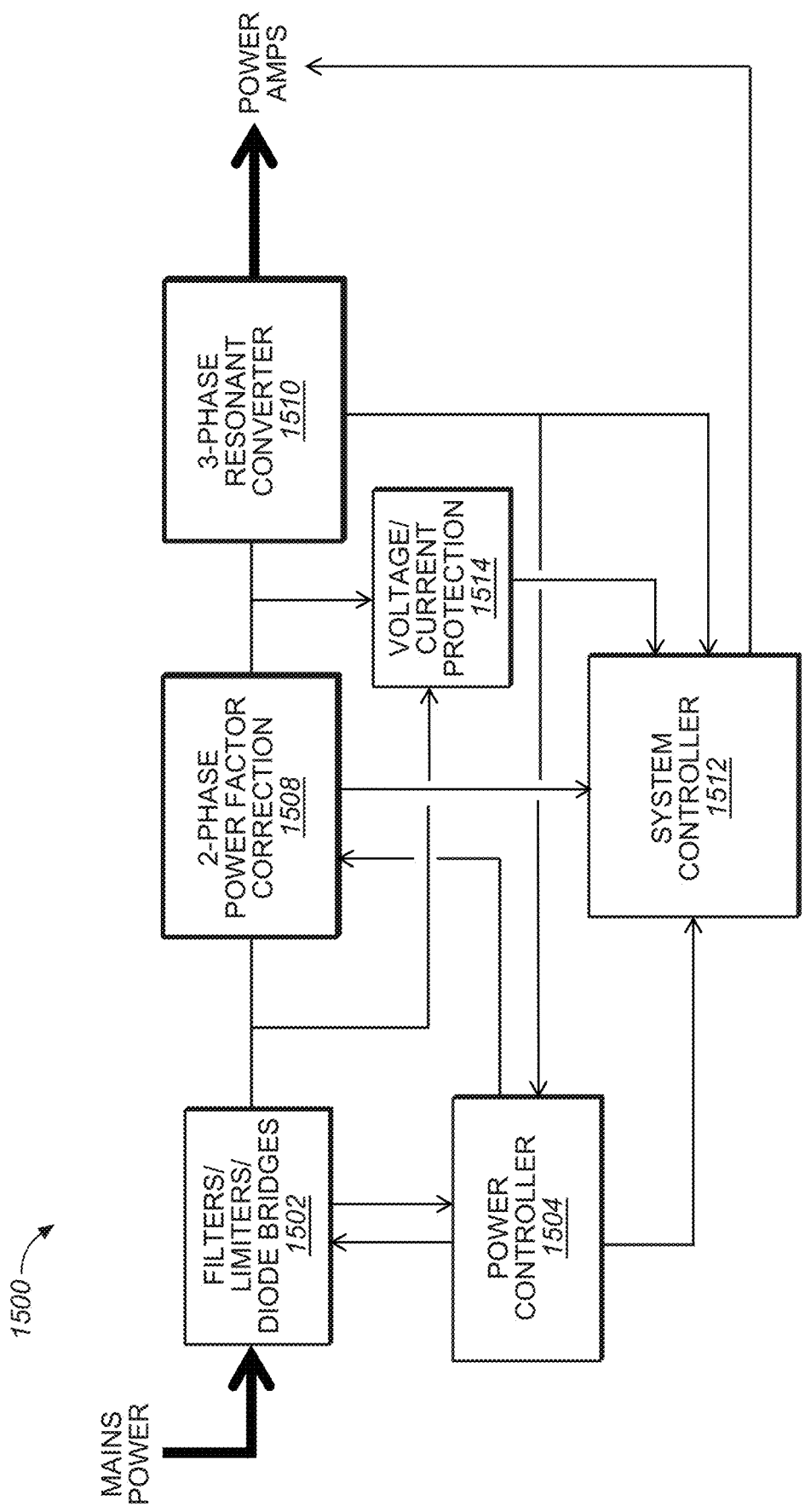
FIG. 15 illustrates a power supply stage for a multi-channel amplifier having multi-phase power factor correction and multi-phase resonant mode, under some embodiments.

FIG. 15 illustrates a power supply stage for a multi-channel amplifier having multi-phase power factor correction and multi-phase resonant mode, under some embodiments. Power supply 1500 includes a multi-phase resonant mode DC-DC power supply component 1510 with phase-loss fault tolerance and detection. This component includes circuitry that provides a high-level of fault tolerance (i.e., device failures), and maintains a reasonable level of operability, such that the amplifier will continue to operate on all or substantially all the channels. It can also inform the user of a fault condition, either through the LED or UI messaging interface, or other alarm or indication method. The multi-phase converter 1510 provides at least two phases of resonant-mode power conversion (or three-phases as shown), where the power supply can continue operating properly even after losing one or more phases. If a phase of the resonant-mode converter fails, the following occurs: (A) the fault is isolated (i.e., it doesn't bring down the remaining phases), (B) the fault is detected and the operator can be notified as needed, (C) the remaining phases can continue to operate as normal, and (D) other amplifier components can employ power limited as needed to keep the power supply circuitry from exceeding long-term maximum threshold values.

For the embodiment of FIG. 15, a multi-phase power factor correction component 1508 with phase-loss fault tolerance and detection is coupled to the converter 1510 as a power factor front-end pre-regulator. This component 1508 effectively operates as another power conversion circuit to provide additional levels of redundancy in the event of failure conditions. The two multi-phase components work together to provide power conversion circuits that take the input (mains) power and provide switching at different phases. Diagnostic circuitry monitors the phases and any lost phases are detected and the fault condition is transmitted to the system controller for reporting through the appropriate user interface (e.g., front panel LED or computer UI). Phase loss can also be transmitted to other amplifier components such as FPGA controller modules that can reduce or limit gains on the channels to allow the power supply to operate with less than the full number of phases. Examples of such an FPGA controller are described in U.S. Provisional Patent Application 62/429,662, filed on Dec. 2, 2016 and entitled "Multi-Channel Amplifier with Continuous Time Class-D Modulator with embedded Programmable Logic Device."

In an embodiment, mains power in the range of 85-264 VAC at 15 A/20 A (depending on geographical region) is provided to the power supply through one or more line filter, limiter, and/or diode bridge components 1502. This input power is monitored by a power controller circuit 1504 that contains sub-components such as a relay timer, power factor correction controller, LLC control, and other similar components. The input power is also transmitted to the multi-phase power factor correction circuit 1508. For the embodiment shown, this is a two-phase component (but any number of phases may be used) that outputs power at an increased level, such as 390V. This power is then input to the multi-phase resonant converter 1510. For the embodiment shown, this is a three-phase component (but any number of phases may be used) that outputs power to the power amplifiers in three phases. For power supply 1500, certain voltage/current measurement and protection circuits 1514 are coupled to various points of the circuitry to measure operating conditions such as AC voltages, thermal conditions, fault protection conditions, and so on. These measurements are transmitted to a system controller 1512 which also takes input from the power controller 1504 and the multi-phase components 1508 and 1510 to provide gain control and enable signals to the power amplifiers.

The multi-phase components 1508 and 1510 operate such that the mains power is increased in two phases to 390V by the power factor correction component 1508. This 390V is then divided into three 63 kHz phases by converter 1510. In an example embodiment, the three phases are 0 degrees, 120 degrees, and 240 degrees, though other phases are also possible. These phases are then fed into the system controller 1512 for monitoring. If any one or two of the phases fails, power is still provided in the remaining phase. The occurrence of a failed phase or phases is reported by the system controller 1512 through the appropriate user interface. This failure information can also be used by the system controller to adjust the gains so that the amplifier can continue to operate in a reduce capacity, such as by limiting gains to one or more of the channels, cutting out certain channels, and other compensatory measures.

This power supply design effectively splits the input power into three (or more) independent and redundant power paths, so that if any one or two paths goes down due to hardware or other failure, the remaining paths continue to provide power. The phases of each component 1508 and 1510 represent the multiple power paths.

Figure 16:
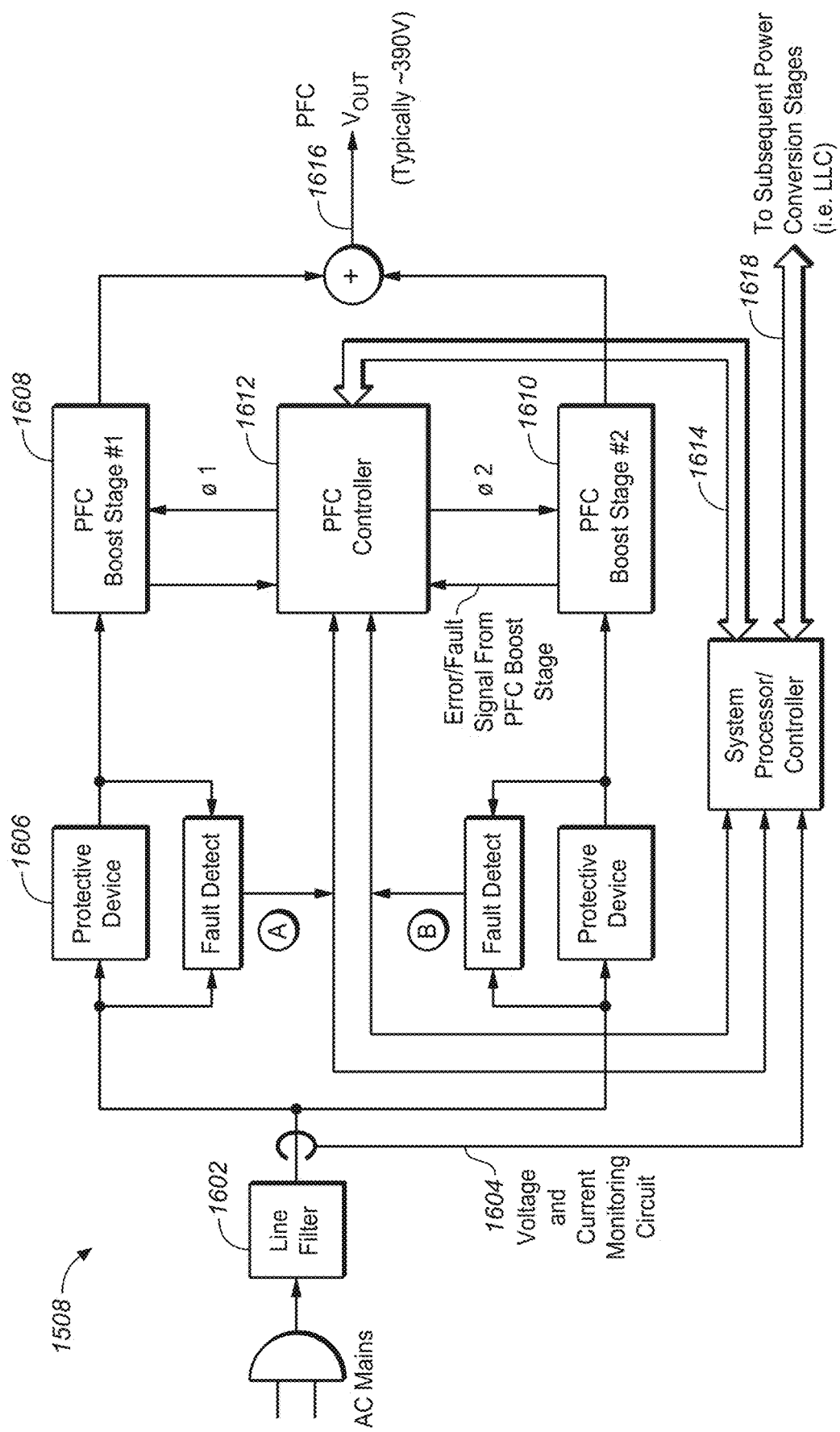
FIG. 16 is a block diagram of the multi-phase power factor correction circuit of FIG. 15, under an embodiment.

FIG. 16 is a block diagram of the multi-phase power factor correction circuit of FIG. 15, under an embodiment. As shown in FIG. 16, the power factor correction (PFC) circuit 1508 takes AC voltage from the mains power supply through a line filter 1602, which distributes the power to a voltage/current monitoring circuit 1604 and an array 1606 of fault detection and protection devices. Each set of fault detection and protection devices is coupled to a respective PFC boost stage. For the embodiment shown, PFC circuit 1508 is a two-phase device so two PFC boost stages 1608 and 1610 are provided to produce the two PFC power phases denoted $\phi_1$ and $\phi_2$. The PFC boost stages boost the input power voltage (e.g., 120 VAC) to a level that is summed together to produce the PFC $V_{out}$ output voltage 1616. In an embodiment, this is on the order of 390V. A PFC controller 1612 controls the phases generated by boost stages 1608 and 1610. The PFC controller receives any fault information from the PFC fault detection/protection components 1606 and provides output to the system controller 1614. Any detected fault condition, such as due to internal hardware failure, or corruption of the mains power input (e.g., drop in level of change in power cycle) is reported by the monitoring circuit 1604 and/or the fault detection components. A failure of any of the boost stages may be manifest as a decrease in the target PFC $V_{out}$ level due to failure to boost the power by the desired amount. The protection devices may implement certain compensation techniques to overcome the detected fault or the system controller may initiate other system wide compensation mechanisms, such as per channel gain limiting or channel cutout. The system controller thus provides output to other subsequent system components, and for the embodiment shown in FIG. 15, this includes the multi-phase resonant mode power supply 1510.

Figure 17:
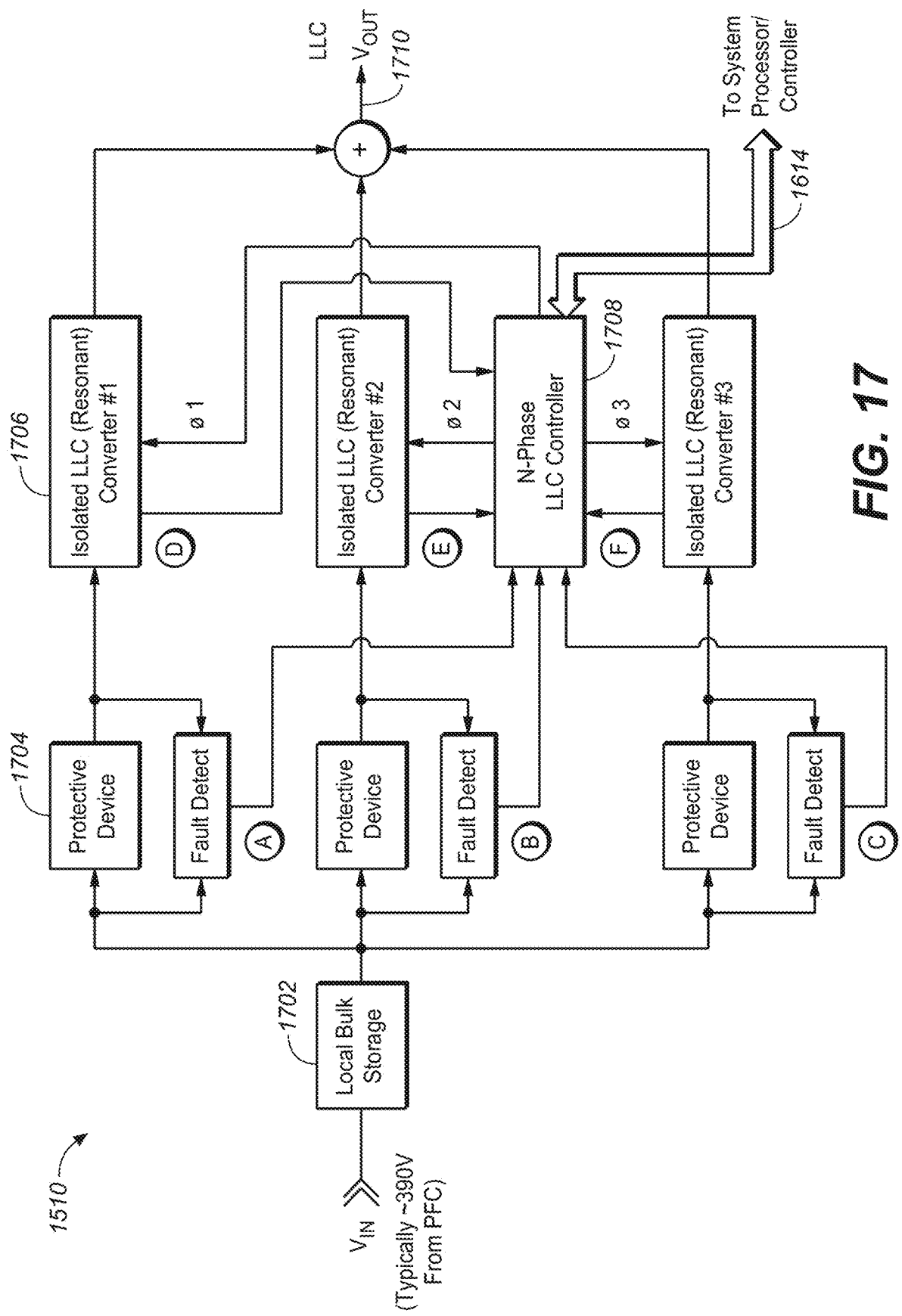
FIG. 17 is a block diagram of the multi-phase resonant mode power supply, under an embodiment.

FIG. 17 is a block diagram of the multi-phase resonant mode power supply, under an embodiment. As shown in FIG. 17, the circuit 1510 is a multi-phase resonant mode DC-DC power supply with phase-loss fault detection and protection. In general, as a resonant mode power supply, circuit 1510 generates current and voltage waveforms that are shaped to sinusoids by inductors (L) and capacitors (C) inserted in the current path, and hence it may be referred to as an "LLC" power supply. Circuit 1510 takes the voltage output from the PFC device 1508 at the 390V output level through a bulk storage device 1702, which distributes the power to an array 1704 of fault detection and protection devices. Each set of fault detection and protection devices is coupled to a respective isolated LLC (resonant) converter 1706. For the embodiment shown, circuit 1510 is a three-phase device so three LLC converters (denoted 1, 2, and 3) are provided to produce the two LLC power phases denoted $\phi_1$, $\phi_2$ and $\phi_3$. The LLC converter stages divide the PFC input power voltage (e.g., 390V) into the three phases (e.g., 0, 120, and 20 degrees) that are summed together to produce the LLC $V_{out}$ output voltage 1710. This output voltage is provided to power amplifiers that generate the individual channel outputs. An LLC controller 1708 controls the phases generated by converter stages 1706. The LLC controller receives any fault information from the LLC fault detection/protection components 1604 and provides output to the system controller 1614. Any detected fault condition for one or more phases, such as due to internal hardware failure, is reported to the system controller, which may then initiate a system wide compensation mechanism to allow the amplifier to operate in a reduced power phase mode.

Although the embodiment of FIG. 15 illustrated an amplifier system that utilizes both the PFC 1508 and LLC 1510 components together, it should be noted that either component can be used alone or in conjunction with other similar components. Additionally, any practical number of phases for either component may be used. The PFC and LLC components may be used alone or together in any appropriate type of audio amplifier that requires a large amount of power and/or may power a high number of individual channels. In an embodiment, the PFC and LLC circuits are incorporated into a multi-channel cinema amplifier, such as shown in FIG. 3.

Figure 18:
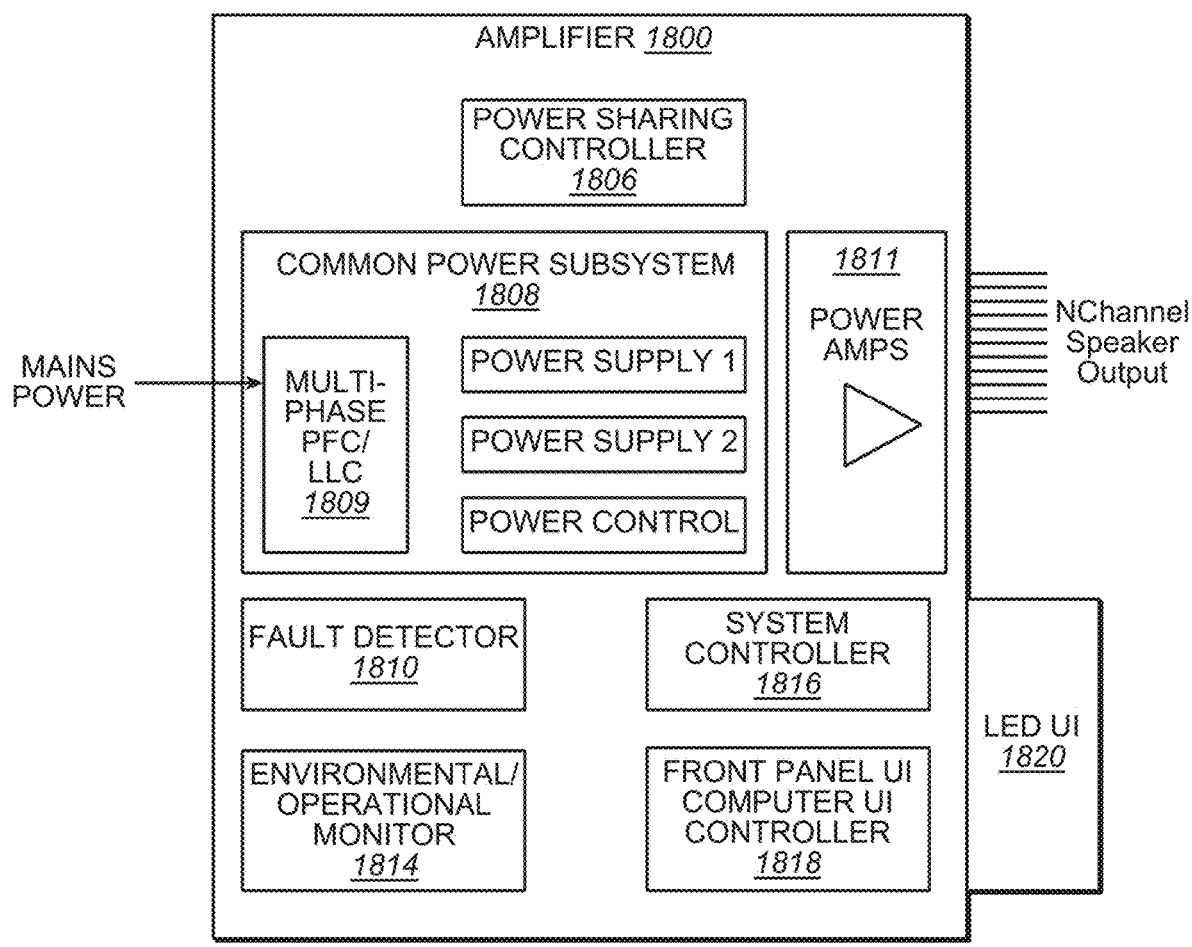
FIG. 18 is a diagram of a multi-channel amplifier incorporating a multi-phase power supply and fault reporting user interface components, under some embodiments.

FIG. 18 is a diagram of a multi-channel cinema amplifier incorporating a multi-phase power supply and fault reporting user interface components, under some embodiments. Amplifier 1800 includes a common power subsystem 1808 that includes two independent power supplies (PS1 and PS2) that provide power to power amps 1811 to drive a number (N) of speaker channels. In an embodiment N may be on the order of 24 to 36 channels, though embodiments are not so limited. A power sharing controller 1806 controls the distribution of power within the system, as described above.

The power subsystem 1808 also includes the multi-phase PFC and LLC components shown and described in FIGS. 16 and 17. These components boost and split the mains power into a number of power phases to provide redundancy of power within the amplifier. In the event of a fault, one or more phases may be compromised but power is still available through the remaining phases. The fault conditions may be reported to a power control unit or the fault detector 1810 and monitor 1814 components. In an embodiment, a system controller 1816 processes any fault conditions reported by the PFC/LLC component 1809 to initiate any appropriate compensation measures, such as gain limiting and so on. In an embodiment, amplifier 1800 also includes a front panel LED controller and/or computer UI controller 1818 to generate appropriate visual messages through a front panel LED array 1820 or computer UI, as described above.

Embodiments of the audio amplifier described herein may be used in any appropriate venue or application, such as cinema, home cinema, live venue, auditorium, industrial facility, military facility, theme park, and so on. Although example implementations are described with respect to certain specified components, such as the Dolby CP850, it should be noted that embodiments are not so limited and any similar or other appropriate component may be used.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," and "hereunder" and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The invention claimed is:

1. An audio amplifier comprising:
    a single, multi-phase power supply stage coupled to mains power and powering a plurality of audio channels each providing respective speaker feeds to a plurality of speakers, and incorporating dual or triple redundancy to prevent a power supply failure condition from compromising the audio channels;
    a monitor component coupled to the power supply and monitoring environmental and operating conditions of the amplifier and the plurality of speakers, and configured to predict and detect a failing speaker; and
    a power controller coupled to the monitor component and adjusting per-channel gain values based on per-channel characteristics, power distribution characteristics, speaker health characteristics, and mains power characteristics.

2. The audio amplifier of claim 1 wherein the audio amplifier is part of a cinema-scale audio system configured to playback immersive audio content in which audio signals being presented to the listener originate from in front of and around the listening position in the horizontal plane and overhead plane, and the number of channels comprises 24 to 64 channels.

3. The audio amplifier of claim 2 wherein the power supply stage includes a multi-phase resonant-mode DC-DC power supply component with phase-loss fault tolerance and detection to provide a high-level of fault tolerance from device failures, and maintains a reasonable level of operability, such that the amplifier will continue to operate on all or substantially all the channels.

4. The audio amplifier of claim 3 further comprising a multi-phase converter providing two or more phases of resonant-mode power conversion to allow the power supply stage to continue operating properly even after losing one or more phases.

5. The audio amplifier of claim 4 wherein, if a phase of the resonant-mode DC-DC power supply component fails, the amplifier detects a fault condition, isolates the fault, notifies an operator of the fault, and allows the remaining phases to operate as normal such using limited power so that other amplifier components can employ the limited power as needed to keep the power supply from exceeding long-term maximum threshold values.

6. The audio amplifier of claim 5 further comprising a multi-phase power factor correction component with phase-loss fault tolerance and detection coupled to the multi-phase resonant-mode DC-DC power supply component as a power factor front-end pre-regulator that operates as additional power conversion circuit to provide further redundancy in the event of failure conditions.

7. The audio amplifier of claim 6 wherein the multi-phase power factor correction component and the multi-phase resonant-mode DC-DC power supply component work together to provide power conversion circuits that take the mains power and provide switching at different phases.

8. The method of claim 7 wherein the monitor component monitors the different phases and detects any lost phases to transmit fault condition information to the system controller for reporting to the user through a user interface comprising one or more of front panel LED lights or a graphical user interface.

9. The method of claim 8 further comprising the monitor component transmitting phase loss information to the power controller to reduce or limit gains on the channels to allow the power supply to operate with less than the full number of phases.

10. The audio amplifier of claim 1 wherein the monitor component is configured to send a signal to the power controller indicating a failed or failing speaker.

11. The audio amplifier of claim 10 further comprising wherein the signal is transmitted to a system administrator or network operation center.

12. A cinema audio playback system for immersive audio content in which audio signals being presented to the listener originate from in front of and around the listening position in the horizontal plane and overhead plane comprising:
an amplifier having a power supply coupled to mains power and providing power to each speaker of a plurality of speakers over respective speaker wires through channel-based speaker feeds;
a single multi-phase power supply stage powering a plurality of audio channels of between 24 to 64 channels, each providing respective speaker feeds to a plurality of speakers, and incorporating dual or triple redundancy to prevent a power supply failure condition from compromising the audio channels; and
a monitor component coupled to the power supply and monitoring environmental and operating characteristics of the amplifier, and operating conditions of the plurality of speakers and configured to predict and detect a failing speaker.

13. The system of claim 12 further comprising a power controller coupled to the monitor component and adjusting per-channel gain values based on per-channel characteristics, power distribution characteristics, speaker health characteristics, and mains power supply characteristics.

14. The system of claim 13 wherein the monitor component is configured to send a signal to the power controller indicating a failed or failing speaker, and wherein the signal is transmitted to a system administrator or network operation center.

15. The system of claim 14 wherein the power supply stage includes a multi-phase resonant-mode DC-DC power supply component with phase-loss fault tolerance and detection to provide a high-level of fault tolerance from device failures, and maintains a reasonable level of operability, such that the amplifier will continue to operate on all or substantially all the channels.

16. The system of claim 15 further comprising a multi-phase converter providing two or more phases of resonant-mode power conversion to allow the power supply stage to continue operating properly even after losing one or more phases, wherein, if a phase of the resonant-mode DC-DC power supply component fails, the amplifier detects a fault condition, isolates the fault, notifies an operator of the fault, and allows the remaining phases to operate as normal such using limited power so that other amplifier components can employ the limited power as needed to keep the power supply from exceeding long-term maximum threshold values.

17. The system of claim 15 wherein the monitor component monitors the phases and detects any lost phases to transmit fault condition information to the system controller for reporting to the user through a user interface comprising one or more of front panel LED lights or a graphical user interface.

18. A method of amplifying audio signals comprising:
powering, by a single, multi-phase power supply stage coupled to mains power, a plurality of audio channels each providing respective speaker feeds to a plurality of speakers, and incorporating dual or triple redundancy to prevent a power supply failure condition from compromising the audio channels;
monitoring environmental and operating conditions of the amplifier and the plurality of speakers to predict and detect a failing speaker or channel; and
adjusting, by a power controller, per-channel gain values based on per-channel characteristics, power distribution characteristics, speaker health characteristics, and mains power characteristics.

19. The method of claim 18 further comprising, in the event of a failed or failing speaker or channel, sending an alert signal to a system administrator or network operation center through one of a front panel visual display or a graphical user interface message.

20. The method of claim 19 wherein the power supply stage includes a multi-phase resonant-mode DC-DC power supply component with phase-loss fault tolerance and detection to provide a high-level of fault tolerance from device failures, and maintains a reasonable level of operability, such that the amplifier will continue to operate on all or substantially all the channels.

* * * * *

UNITED STATES PATENT AND TRADEMARK OFFICE
CERTIFICATE OF CORRECTION

| | | |
|---|---|---|
| PATENT NO. | : 11,418,109 B2 | Page 1 of 1 |
| APPLICATION NO. | : 17/400856 | |
| DATED | : August 16, 2022 | |
| INVENTOR(S) | : Andrew Healy et al. | |

It is certified that error appears in the above-identified patent and that said Letters Patent is hereby corrected as shown below:

In the Claims

Column 29, Claim 8, Line 37, delete "method" and insert --audio amplifier--.

Column 29, Claim 9, Line 43, delete "method" and insert --audio amplifier--.

Signed and Sealed this
Eleventh Day of February, 2025

Coke Morgan Stewart
*Acting Director of the United States Patent and Trademark Office*